United States Patent
Aoi

(10) Patent No.: US 6,171,979 B1
(45) Date of Patent: *Jan. 9, 2001

(54) SEMICONDUCTOR DEVICE AND METHOD OF PRODUCING THE SAME

(75) Inventor: Nobuo Aoi, Hyogo (JP)

(73) Assignee: Matsushita Electric Industrial Co., Ltd., Osaka (JP)

( * ) Notice: Under 35 U.S.C. 154(b), the term of this patent shall be extended for 0 days.

This patent is subject to a terminal disclaimer.

(21) Appl. No.: 09/178,765

(22) Filed: Oct. 26, 1998

Related U.S. Application Data

(63) Continuation of application No. 08/726,497, filed on Oct. 7, 1996, now Pat. No. 5,942,802.

(30) Foreign Application Priority Data

| Oct. 9, 1995 | (JP) | 7-261487 |
| Mar. 6, 1996 | (JP) | 8-048597 |

(51) Int. Cl.$^7$ .................. H01L 21/31; H01L 21/469
(52) U.S. Cl. .................. 438/778; 438/780; 438/781; 438/790
(58) Field of Search ................ 438/778, 763, 438/960, 623, 624, 780, 781, 787, 789, 790

(56) References Cited

U.S. PATENT DOCUMENTS

| 4,885,262 | * | 12/1989 | Ting et al. . |
| 4,988,514 | * | 1/1991 | Fukuyama et al. . |
| 5,504,042 | * | 4/1996 | Cho et al. . |
| 5,569,628 | * | 10/1996 | Yano et al. . |
| 5,620,531 | * | 4/1997 | Ikai et al. . |
| 5,723,909 | * | 3/1998 | Yano et al. ............. 257/760 |
| 5,753,967 | * | 5/1998 | Lin . |
| 5,847,443 | * | 12/1998 | Cho et al. ............. 438/763 |

FOREIGN PATENT DOCUMENTS

| 60-86018 | * | 5/1985 | (JP) . |
| 63-208248 | | 8/1988 | (JP) . |
| 1-235254 | | 9/1989 | (JP) . |
| 3-198327 | | 8/1991 | (JP) . |
| 5-283542 | | 10/1993 | (JP) . |
| 7-321206 | | 12/1995 | (JP) . |
| 9-106983 | | 4/1997 | (JP) . |

OTHER PUBLICATIONS (Author Unknown) "Lithographic Patterns with Barrier Lining" IBM Tech. Disclosure Bull. vol. 32, No. 10B pp. 114–115, Mar. 1990.*

* cited by examiner

*Primary Examiner*—Charles Bowers
*Assistant Examiner*—Thanh Nguyen
(74) *Attorney, Agent, or Firm*—McDermott, Will & Emery

(57) ABSTRACT

Using a CVD method, there is deposited, on a semiconductor substrate, a first silicon oxide layer on which a porous layer is then deposited. The porous layer is then etched to form a wiring groove. Using a CVD method, a second silicon oxide layer is deposited throughout the surface of the porous layer, and the first and second silicon oxide layers are etched to form a through-hole therein. Then, a conductive layer is deposited throughout the surface of the semiconductor substrate. Then, the conductive layer is subjected to CMP to form a wiring layer composed of the conductive layer.

3 Claims, 23 Drawing Sheets

SILANOL CONDENSATE  + SILILATION REAGENT   SILILATED SILANOL CONDENSATE

TETRAETHOXYSILANE    SILANOL

TRIETHOXYSILANE    SILANOL

SEMICONDUCTOR DEVICE AND METHOD OF PRODUCING THE SAME

This is a continuation of application Ser. No. 08/726,497, filed Oct. 7, 1996 now U.S. Pat. No. 5,942,802.

BACKGROUND OF THE INVENTION

The present invention relates to a semiconductor device comprising an interlaminar insulating layer disposed on a wiring layer and composed of a porous layer or an SOG layer, and a method of producing the same.

As examples of the material forming an interlaminar insulating layer in a semiconductor device, there have conventionally been known organic and inorganic materials. An interlaminar insulating layer formed of an organic material is disadvantageously poor in heat resistance although its relative dielectric constant is relatively low, while an interlaminar insulating layer made of an inorganic material is disadvantageously high in relative dielectric constant although its heat resistance is excellent.

As the interlaminar insulating layer formed of an organic material low in relative dielectric constant, there is known an aggregate layer comprising organic silanol condensate particulates each having a structure as shown in FIG. 18. More specifically, each organic silanol condensate particulate is arranged such that silicon-alkyl group bonds (organic units) are uniformly dispersed, in the molecular level, in silicon-oxygen bonds (inorganic units) and that silanol groups (Si—OH) are present on the surface thereof. In FIG. 18, R is an alkyl group such as $CH_3$, $C_2H_5$, $C_6H_5$ or the like.

An interlaminar insulating layer of prior art is formed in the following manner. A TEOS derivative having an alkyl group as a substituent group (in which silicon-alkyl group bonds are substantially uniformly dispersed, in the molecular level, in silicon-oxygen bonds) is hydrolyzed and then dehydrated and condensed to prepare a silica sol, and the silica sol thus prepared is applied onto a semiconductor substrate and then thermally treated, thus forming an interlaminar insulating layer.

Each of the organic silanol condensate particulates forming an insulating layer composed of an SOG layer of prior art is arranged, as mentioned above, such that silicon-alkyl group bonds (organic units) are uniformly dispersed, in the molecular level, in silicon-oxygen bonds (inorganic units), and the silicon-alkyl group bonds are less stable than the silicon-oxygen bonds. Therefore, a variety of problems arise as set forth below. However, the following description will first discuss, as a premise, a process of forming a contact hole in an insulating layer composed of an SOG layer formed on a semiconductor substrate having a metallic layer.

As shown in FIG. 19(a), the first layer of SiO, 102 having a thickness of 50 nm is deposited, by a CVD method, throughout the surface of the first metallic wiring layer of aluminium 101 formed on a semiconductor substrate 100. After an interlaminar insulating layer 103 composed of an SOG layer is deposited on the first layer of $SiO_2$ 102, the second layer of $SiO_2$ 104 having a thickness of 100 nm is deposited on the interlaminar insulating layer 103 by a CVD method as shown in FIG. 19(b).

Then, a resist pattern 105 composed of organic matter is formed on the second layer of $SiO_2$ 104 as shown in FIG. 19(c). Then, using the resist pattern 105, the first layer of $SiO_2$ 102, the interlaminar insulating layer 103 and the second layer of $SiO_2$ 104 are etched to form a contact hole 106 as shown in FIG. 20(a).

As shown in FIG. 20(b), the resist pattern 105 is then removed using oxygen plasma.

As mentioned earlier, the silicon-alkyl group bonds are less stable than the silicon-oxygen bonds. Accordingly, oxidative decomposition of the silicon-alkyl group bonds proceeds deep in the lateral wall of the contact hole 106 in the interlaminar insulating layer 103. Side-etching disadvantageously occurs in those portions of the interlaminar insulating layer 103 exposed to the contact hole 106 as shown in FIG. 20(b).

Due to the heat from a surface thermal treatment conducted just before the second layer of metallic wiring 107 is embedded in the contact hole 106 (See FIG. 21), moisture is generated from the interlaminar insulating layer 103 as shown in FIG. 20(c). Disadvantageously, the interlaminar insulating layer 103 absorbs moisture to increase the dielectric constant, and the surface of the first metallic wiring layer of aluminium 101 is oxidized to increase the contact resistance.

When the second layer of metallic wiring 107 is deposited as shown in FIG. 21, a void 108 is generated in the second layer of metallic wiring 107 due to the side-etching above-mentioned. This disadvantageously causes the second layer of metallic wiring 107 to be reduced in thickness or to be disconnected.

There is desired an interlaminar insulating layer low in relative dielectric constant yet assuring the heat resistance. In this connection, the following technique is proposed to form cm interlaminar insulating layer composed of a porous layer.

FIG. 22 shows a sectional structure of a semiconductor device disclosed by Japanese Patent Publication No. 7-46698. As shown in FIG. 22, a metallic wiring 111 is formed on a semiconductor substrate 110 and an interlaminar insulating layer 112 composed of a porous layer is formed throughout the surface of the semiconductor substrate 110 including the metallic wiring 111.

FIG. 23 shows a sectional structure of a semiconductor device disclosed by Japanese Patent Publication No. 6-12790. As shown in FIG. 23, a metallic wiring 121 is formed on a semiconductor substrate 120 and a first SOG layer 122 is formed, by a CVD method, throughout the surface of the semiconductor substrate 120 including the metallic wiring 121. Then, an organic porous layer 123 is formed on the first SOG layer 122, and a second SOG layer 124 is then formed on the porous layer 123 by a CVD method. These first SOG layer 122, the organic porous layer 123 and the second SOG layer 124 form an interlaminar insulating layer.

In any of the publications above-mentioned, however, no particular description has been made of how to form the porous layer. Accordingly, porous layer forming methods discussed in the following papers are now taken into consideration.

As a first porous layer forming method, there is mentioned a method disclosed by IEEE Transactions on components, hybrids, and manufacturing technology, Vol. 15, No. 6 p. 925 (1992). More specifically, there is formed an organic high polymer layer composed of a co-polymer comprising an organic high polymer precursor high in heat resistance and an organic high polymer precursor low in heat resistance, and the organic high polymer layer thus formed is then thermally treated to decompose the organic portion low in heat resistance, thus forming a porous layer composed of an organic high polymer material.

As a second porous layer forming method, there is mentioned a method disclosed by Makromol. Chem., Macromol. Symp. 42/43, 393 (1991). More specifically, a silica film containing an organic high polymer is formed from a mixture solution of a silanol sol and an organic high polymer, and then thermally treated to pyrolytically decompose the organic high polymer, thus forming a porous layer composed of an inorganic material.

However, when forming an embedded wiring in an interlaminar insulating layer composed of a porous layer, the following problem arises. When a concave groove for an embedded wiring is formed in the interlaminar insulating layer composed of a porous layer and a wiring material is embedded in the concave groove thus formed, the wiring material enters holes in the porous layer. This disadvantageously deteriorates the insulating properties of the interlaminar insulating layer composed of a porous layer. Further, the wiring layer becomes uneven at the lateral side thereof to deteriorate the resistance to electromigration of the wiring layer. This disadvantageously deteriorates the stability of electric characteristics of the semiconductor device. It is therefore difficult to form an embedded wiring in the interlaminar insulating layer composed of a porous layer.

According to the first porous layer forming method, to thermally treat the organic high polymer layer, the semiconductor substrate is required to be maintained at a temperature of 275° C. for about nine hours. This disadvantageously takes much time for a treatment of making the organic high polymer layer porous. Accordingly, it would be considered to form a porous layer in a short period of time by raising the temperature of the heat treatment. However, if the substrate is thermally treated at a temperature of not less than 400° C., the organic high polymer is inevitably decomposed. Thus, raising the treatment temperature could not be a radical solving means.

According to the second porous layer forming method, the semiconductor substrate is required to be maintained at a temperature of 600° C. for about 24 hours. This also disadvantageously takes much time. Accordingly, it would also be considered to form a porous layer in a short period of time by raising the temperature of the heat treatment. However, if the treatment temperature is raised, the glass component of the inorganic material is molten and the molten glass component closes holes in the porous layer. Thus, this could neither be a radical solving means.

As discussed in the foregoing, each of the porous layer forming methods of prior art cannot be utilized for forming an interlaminar insulating layer composed of a porous layer in the production process of a semiconductor device.

In view of the foregoing, it is a first object of the present invention to make provision such that an embedded wiring can be formed in an interlaminar insulating layer. It is a second object of the present invention to make provision such that an interlaminar insulating layer composed of a porous layer can be formed at a low temperature under a normal pressure in a short period of time. It is a third object of the present invention to provide an insulating layer which is hardly side-etched by oxygen plasma used for removing the resist pattern, and which hardly generates moisture even though heated, thus not only preventing the upper metallic wiring of the semiconductor device from being reduced in thickness and from being disconnected, but also reducing the contact resistance between the lower and upper metallic wirings to restrain the relative dielectric constant from being increased clue to moisture absorption.

SUMMARY OF THE INVENTION

A first semiconductor device according to the present invention comprises: a semiconductor substrate having a first wiring layer formed thereon; a first silicon oxide layer formed on the semiconductor substrate; a porous layer formed on the first silicon oxide layer; a through-hole formed in the first silicon oxide layer; a wiring groove formed in the porous layer and communicating with the through-hole; a second silicon oxide layer formed in the bottom and wall of the wiring groove; a contact comprising a conductive layer embedded in the through-hole; and a second wiring layer composed of a conductive layer embedded inside of the second silicon oxide layer inside of the wiring groove.

According to the first semiconductor device, the second silicon oxide layer is formed on the bottom and wall of the wiring groove formed in the porous layer, and the second wiring layer is embedded inside of the second silicon oxide layer. That is, the second silicon oxide layer is interposed between the second wiring layer and the porous layer. This prevents the conductive material forming the second wiring layer from entering holes in the porous layer. This not only prevents the interlaminar insulating layer composed of the porous layer from being deteriorated in insulating properties, but also prevents the second wiring layer from being deteriorated in the resistance to electromigration. This enables an embedded wiring to be formed in the interlaminar insulating layer composed of the porous layer.

In the first semiconductor device, the porous layer is preferably composed of an organic or inorganic SOG layer. When the porous layer is composed of an organic SOG layer, there can be achieved an insulating layer low in relative dielectric constant, and when the porous layer is composed of an inorganic SOG layer, there can be achieved an insulating layer excellent in heat resistance.

A second semiconductor device according to the present invention comprises: a metallic layer formed on a semiconductor substrate; and an insulating layer formed around the metallic layer and composed of a composite layer comprising (i) first silanol condensate particulates each of which contains at least either fluorine-silicon bonds or organic group-silicon bonds, and (ii) second silanol condensate particulates each of which contains only oxygen-silicon bonds, the first and second silanol condensate particulates being dispersedly mixed in the composite layer.

According to the second semiconductor device, in the first silanol condensate particulates located in the outermost surface of the insulating layer, the silicon-alkyl group bonds are oxidatively decomposed by oxygen plasma. However, second silanol condensate particulates containing only oxygen-silicon bonds are present at the insides of the first silanol condensate particulates located in the outermost surface of the insulating layer. The second silanol condensate particulates contain only oxygen-silicon bonds and are therefore not oxidatively decomposed by oxygen plasma. Accordingly, the oxidative decomposition does not proceed deeply in the insulating layer and the insulating layer hardly generates moisture. This not only prevents the upper metallic wiring in the semiconductor device from being reduced in thickness and from being disconnected, but also lowers the contact resistance between the upper and lower metallic wirings. Further, the first silanol condensate particulates containing at least either fluorine-silicon bonds or organic group-silicon bonds, are dispersed in the insulating layer. This lowers the density and polarization rate of the insulating layer, thus reducing the relative dielectric constant thereof.

A third semiconductor device according to the present invention comprises: a metallic layer formed on a semiconductor substrate; and an insulating layer formed around the metallic layer and composed of an aggregate layer comprising capsular particles in each of which the silanol condensate particulate containing at least either fluorine-silicon bonds or organic group-silicon bonds is being chemically modified by silanol containing only oxygen-silicon bonds.

According to the third semiconductor device, each capsular particle is arranged such that the silanol condensate particulate containing at least either fluorine-silicon bonds or organic group-silicon bonds is chemically modified by silanol containing only oxygen-silicon bonds. Therefore, the silanol condensate particulates do not come in direct contact with oxygen plasma, and the silanol which is located in the surface of each capsular particle and which contains only oxygen-silicon bonds, is not oxidatively decomposed by oxygen plasma. Accordingly, the insulating layer is not oxidatively decomposed and hardly generates moisture. This not only prevents the upper metallic wiring of the semiconductor device from being reduced in thickness and from being disconnected, but also reduces the contact resistance between the lower and upper metallic wirings. Further, since the insulating layer comprises the silanol condensate particulates containing at least either fluorine-silicon bonds or organic group-silicon bonds, the insulating layer is lowered in density to reduce the relative dielectric constant thereof.

A fourth semiconductor device according to the present invention comprises: a metallic layer formed on a semiconductor substrate; and an insulating layer formed around the metallic layer and composed of an aggregate layer comprising capsular particles in each of which the silanol condensate particulate containing only oxygen-silicon bonds is being chemically modified by silanol containing at least either fluorine-silicon bonds or organic group-silicon bonds.

According to the fourth semiconductor device, in the capsular particles located in the outermost surface of the insulating layer, the silanol containing at least either fluorine-silicon bonds or organic group-silicon bonds is oxidatively decomposed by oxygen plasma. However, the inorganic silanol condensate particulates present at the inner sides of the capsular particles are not oxidatively decomposed by oxygen plasma. Accordingly, the oxidative decomposition due to oxygen plasma does not proceed inside of the insulating layer and the insulating layer hardly generates moisture. This not only prevents the upper metallic wiring of the semiconductor device from being reduced in thickness and from being disconnected, but also reduces the contact resistance between the lower and upper metallic wirings. Further, since the insulating layer comprises capsular particles chemically modified by silanol containing at least either fluorine-silicon bonds or organic group-silicon bonds, the insulating layer is lowered in density to reduce the relative dielectric constant thereof.

A fifth semiconductor device according to the present invention comprises: a metallic layer formed on a semiconductor substrate; and an insulating layer formed around the metallic layer and composed of an aggregate layer comprising silanol condensate particulates which contain only oxygen-silicon bonds and in which at least portions of the hydroxyl groups on the surfaces thereof are being substituted by silyl groups.

According to the fifth semiconductor device, the silyl groups on the surfaces of the silanol condensate particulates located in the outermost surface of the insulating layer are eliminated by oxygen plasma, but the silanol condensate particulates are not oxidatively decomposed by oxygen plasma because they contain oxygen-silicon bonds. Accordingly, the oxidative decomposition due to oxygen plasma does not proceed inside of the insulating layer and the insulating hardly generates moisture. This not only prevents the upper metallic wiring of the semiconductor device from being reduced in thickness and from being disconnected, but also reduces the contact resistance between the lower and upper metallic wirings. Further, since the insulating layer comprises silanol condensate particulates or siloxane polymers in which at least portions of the hydroxyl groups are being substituted by silyl groups, the insulating layer is lowered in density to reduce the relative dielectric constant thereof.

A first semiconductor device producing method according to the present invention comprises: a first step of depositing a first silicon oxide layer on a semiconductor substrate having a first wiring layer formed thereon; a second step of depositing a porous layer on the first silicon oxide layer; a third step of forming a wiring groove in the porous layer; a fourth step of depositing a second silicon oxide layer on the porous layer including the wiring groove such that the wiring groove is not filled up with the second silicon oxide layer; a fifth step of forming a through-hole in each of the second and first silicon oxide layers: a sixth step of depositing a conductive layer throughout the surface of the second silicon oxide layer including both the through-hole and the wiring groove; and a seventh step of removing those portions of the conductive layer exposed on the second silicon oxide layer, thus forming a second wiring layer composed of the conductive layer.

According to the first semiconductor device producing method, after the wiring groove is formed in the porous layer deposited on a semiconductor substrate through the first silicon oxide layer, a second silicon oxide layer is deposited on the porous layer including the wiring groove and the conductive layer is then deposited to form the second wiring layer. That is, the conductive layer is deposited with the second silicon oxide layer formed on the bottom and wall of the wiring groove in the porous layer. This prevents the conductive material forming the second wiring layer from entering holes in the porous layer. Thus, there can securely be produced the first semiconductor device capable of not only preventing the interlaminar insulating layer composed of the porous layer from being deteriorated in insulating properties, but also preventing the second wiring layer from being deteriorated in the resistance to electromigration.

In the first semiconductor device producing method, the second step preferably comprises the steps of: adding a silylation reagent to a silanol sol solution containing silanol condensate particulates to chemically modify the residual silanol groups of the silanol condensate particulates by silyl groups; coating the surface of the semiconductor substrate with the silanol sol solution containing the silanol condensate particulates chemically modified by the silyl groups, thus forming a coating film; and thermally treating the coating film such that the silyl groups are pyrolytically decomposed and that the residual silanol groups are dehydrated and condensed, thus making the coating film porous.

When a semiconductor substrate is coated at the surface thereof with a silanol sol solution containing silanol condensate particulates chemically modified by silyl groups, thus forming a coating film and the coating film thus formed is thermally treated, the silyl groups which chemically modify the silanol condensate particulates, are pyrolytically decomposed to form holes among silanol condensate particulates. Further, the residual silanol groups are dehydrated and condensed, and the silanol condensate particulates are so condensed as to surround the holes. Accordingly, the coating film on the semiconductor substrate is securely made porous. Thus, there can securely be formed an interlaminar insulating layer having a porous layer composed of an inorganic material.

In the first semiconductor device producing method, the second step preferably comprises the steps of: adding a silylation reagent to a silanol solution in the presence of acid or alkali to chemically modify, by silyl groups, the residual silanol groups of silanol contained in the silanol solution; coating the surface of the semiconductor substrate with the silanol solution containing the silanol chemically modified by the silyl groups, thus forming a coating film; and thermally treating the coating film such that the silyl groups are pyrolytically decomposed and that the residual silanol groups are dehydrated and condensed, thus making the coating film porous.

When a semiconductor substrate is coated at the surface thereof with a silanol solution containing silanol chemically modified by silyl groups, thus forming a coating film which is then thermally treated, the residual silanol groups are so dehydrated and condensed as to surround the holes formed by the pyrolytical decomposition of the silyl groups, thereby to form silanol condensate particulates each incorporating holes. Thus, there can securely be formed an interlaminar insulating layer having a porous layer composed of an inorganic material.

A second semiconductor device producing method according to the present invention comprises: an interlaminar insulating layer forming step of forming, on a semiconductor substrate having a first wiring layer formed thereon, an interlaminar insulating layer composed of a porous layer; and a wiring layer forming step of forming a second wiring layer on the interlaminar insulating layer, the interlaminar insulating layer forming step comprising the steps of: adding a silylation reagent to a silanol sol solution containing silanol condensate particulates to chemically modify the residual silanol groups of the silanol condensate particulates by silyl groups; coating the surface of the semiconductor substrate with the silanol sol solution containing the silanol condensate particulates chemically modified by the silyl groups, thus forming a coating film; and thermally treating the coating film such that the silyl groups are pyrolytically decomposed and that the residual silanol groups are dehydrated and condensed, thus making the coating film porous.

According to the second semiconductor device producing method, the silyl groups which chemically modify the silanol condensate particulates, are pyrolytically decomposed to form holes among the silanol condensate particulates, and the residual silanol groups are dehydrated and condensed and the silanol condensate particulates are so condensed as to surround the holes. Accordingly, the coating film on the semiconductor substrate is securely made porous. Thus, there can securely be formed an interlaminar insulating layer composed of a porous layer of an inorganic material.

A third semiconductor device producing method comprises: an interlaminar insulating layer forming step of forming, on a semiconductor substrate having a first wiring layer formed thereon, an interlaminar insulating layer formed of a porous layer; and a wiring layer forming step of forming a second wiring layer on the interlaminar insulating layer, the interlaminar insulating layer forming step comprising the steps of: adding a silylation reagent to a silanol solution in the presence of acid or alkali to chemically modify, by silyl groups, the residual silanol groups of silanol contained in the silanol solution; coating the surface of the semiconductor substrate with the silanol solution containing the silanol chemically modified by the silyl groups, thus forming a coating film; and thermally treating the coating film such that the silyl groups are pyrolytically decomposed and that the residual silanol groups are dehydrated and condensed, thus making the coating film porous.

According to the third semiconductor device producing method, the residual silanol is so dehydrated and condensed as to surround the holes formed by the pyrolytical decomposition of the silyl groups, thus forming silanol condensate particulates each incorporating holes. Therefore, there can securely be formed an interlaminar insulating layer composed of the porous layer of an inorganic material.

A fourth semiconductor device producing method comprises the steps of: mixing, in a liquid phase, a first silica sol containing first silanol condensate particulates each of which contains at least either fluorine-silicon bonds or organic group-silicon bonds, with a second silica sol containing second silanol condensate particulates each of which contains only oxygen-silicon bonds, such that a mixture silica sol is formed; and supplying the mixture silica sol to a semiconductor substrate having a metallic layer formed thereon, and then thermally treating the semiconductor substrate, thereby to form an insulating layer composed of a composite layer in which the first and second silanol condensate particulates are dispersedly mixed.

According to the fourth semiconductor device producing method, a first silica sol comprising first silanol condensate particulates containing at least either fluorine-silicon bonds or organic group-silicon bonds, is mixed with a second silica sol comprising second silanol condensate particulates containing only oxygen-silicon bonds, thereby to prepare a mixture silica sol. The mixture silanol sol solution is supplied onto a semiconductor substrate and the semiconductor substrate is then thermally treated to form, on the semiconductor substrate, a composite layer in which the first and second silanol condensate particulates are dispersedly mixed. Thus, there can securely be produced the second semiconductor device.

A fifth semiconductor device producing method comprises the steps of: mixing a silica sol containing silanol condensate particulates each of which contains at least either fluorine-silicon bonds or organic group-silicon bonds, with silicon alkoxide containing no silicon-alkyl group bonds such that a mixture silica sol is formed; and supplying the mixture silica sol onto a semiconductor substrate having a metallic layer formed thereon, and then thermally treating the semiconductor substrate, thereby to form an interlaminar insulating layer composed of an aggregate layer comprising capsular particles in each of which the silanol condensate particulate is being chemically modified by silanol containing only oxygen-silicon bonds.

According to the fifth semiconductor device producing method, silicon alkoxide containing no silicon-alkyl group bonds is mixed with a silica sol comprising silanol condensate particulates containing at least either fluorine-silicon bonds or organic group-silicon bonds to prepare a mixture silica sol, the mixture silica sol thus prepared is supplied onto a semiconductor substrate and the semiconductor substrate is then thermally treated. Thus, there is formed, on the semiconductor substrate, an aggregate layer comprising capsular particles in each of which the silanol condensate particulate is being chemically modified by silanol containing only oxygen-silicon bonds. Therefore, there can securely be produced the third semiconductor device.

In the fifth semiconductor device producing method, the silicon alkoxide preferably comprises at least one selected from the group consisting of tetraethoxysilane, tetramethoxysilane, triethoxysilane, trimethoxysilane and triethoxyfluorosilane.

A sixth semiconductor device producing method according to the present invention comprises the steps of: mixing a silica sol containing silanol condensate particulates each of which contains only oxygen-silicon bonds, with silicon alkoxide containing silicon-alkyl group bonds such that a mixture silica sol is formed; and supplying the mixture silica sol onto a semiconductor substrate having a metallic layer formed thereon, and then thermally treating the semiconductor substrate, thereby to form an insulating layer composed of an aggregate Layer comprising capsular particles in each of which the silanol condensate particulate is being chemically modified by silanol containing at least either fluorine-silicon bonds or organic group-silicon bonds.

According to the sixth semiconductor device producing method, silicon alkoxide containing silicon-alkyl group bonds is mixed with a silica sol containing silanol condensate particulates which contain only oxygen-silicon bonds, thereby to prepare a mixture silica sol, the mixture silica sol thus prepared is supplied onto a semiconductor substrate, and the semiconductor substrate is then thermally treated. Thus, there is formed, on the semiconductor substrate, an aggregate layer comprising capsular particles in each of which the silanol condensate particulate is being chemically modified by silanol containing at least either fluorine-silicon bonds or organic group-silicon bonds. Thus, the fourth semiconductor device can securely be produced.

In the sixth semiconductor device producing method, the silicon alkoxide preferably comprises triethoxymethylsilane.

A seventh semiconductor device producing method according to the present invention comprises: a first step of silylating, in a silica sol containing silanol condensate particulates containing only oxygen-silicon bonds, the surfaces of the silanol condensate particulates; and a second step of supplying, onto a semiconductor substrate having a metallic layer formed thereon, the silica sol containing the silanol condensate particulates having silylated surfaces, and then thermally treating the semiconductor substrate, thereby to form an insulating layer composed of an aggregate layer comprising silanol condensate particulates which contain only oxygen-silicon bonds and in which at least portions of the hydroxyl groups on the surfaces thereof are being substituted by silyl groups.

According to the seventh semiconductor device producing method, a silica sol containing silanol condensate particulates which contain only oxygen-silicon bonds and of which surfaces are silylated, is supplied onto a semiconductor substrate and the semiconductor substrate is then thermally treated. Thus, there is formed, on the semiconductor substrate, an aggregate layer comprising silanol condensate particulates which contain only oxygen-silicon bonds and in which at least portions of the hydroxyl groups on the surfaces thereof are being substituted by silyl groups. Thus, the fifth semiconductor device can securely be produced.

In the seventh semiconductor device producing method, the first step preferably comprises causing the silica sol to react with a silylation reagent in a liquid phase such that at least portions of the hydroxyl groups on the surfaces of the silanol condensate particulates are substituted by silyl groups. In such an arrangement, the silica sol containing silylated silanol condensate particulates can be supplied onto the semiconductor substrate.

An eighth semiconductor device producing method comprising: a first step of supplying, onto a semiconductor substrate having a metallic layer formed thereon, a silica sol containing silanol condensate particulates containing only oxygen-silicon bonds; a second step of silylating the surfaces of the silanol condensate particulates in the silica sol; and a third step of thermally treating the semiconductor substrate to form an insulating layer composed of an aggregate layer comprising silanol condensate particulates which contain only oxygen-silicon bonds and in which at least portions of the hydroxyl groups on the surfaces thereof are being substituted by silyl groups.

According to the eighth semiconductor device producing method, a silica sol containing silanol condensate particulates containing only oxygen-silicon bonds is supplied onto a semiconductor substrate, the surfaces of the silanol condensate particulates are silylated on the semiconductor substrate, and the semiconductor substrate is then thermally treated. Thus, there is formed, on the semiconductor substrate, an aggregate layer comprising silanol condensate particulates which contain only oxygen-silicon bonds and in which at least portions of the hydroxyl groups on the surfaces thereof are being substituted by silyl groups. Accordingly, the surfaces of the silanol condensate particulates can be silylated on the semiconductor substrate.

In the eighth semiconductor device producing method, the second step preferably comprises supplying a silylation reagent in the form of gas to the semiconductor substrate under heating.

In such an arrangement, a silylation reagent in the form of gas is supplied to the semiconductor substrate while heating the semiconductor substrate to which a silica sol containing silanol condensate particulates containing only oxygen-silicon bonds has been supplied. This accelerates the silylation of the silanol condensate particulates.

In the eighth semiconductor device producing method, the second step preferably comprises: causing the silica sol to react, on the semiconductor substrate, with a silylation reagent in a liquid phase such that the hydroxyl groups on the surfaces of the silanol condensate particulates are substituted by silyl groups; and heating the semiconductor substrate to substitute the residual hydroxyl groups on the surfaces of the silanol condensate particulates by silyl groups.

In such an arrangement, after the hydroxyl groups on the surfaces of the silanol condensate particulates are substituted by silyl groups on the semiconductor substrate, the semiconductor substrate is heated to substitute the residual hydroxyl groups on the surfaces of the silanol condensate particulates by silyl groups. Thus, the silanol condensate particulates can securely be silylated.

In the eighth semiconductor device producing method, the second step preferably comprises silylating the surfaces of the silanol condensate particulates under a high pressure.

In such an arrangement, the silylation of the silanol condensate particulates is successfully accelerated.

In the eighth semiconductor device producing method, the silylation reagent preferably comprises at least one selected from the group consisting of hexamethyldisilazane, hexamethyldisiloxane and trimethychlorosilane.

DETAILED DESCRIPTION OF THE INVENTION (First Embodiment)

Referring to FIG. 1(a) to FIG. 1(d), the following description will discuss a semiconductor device according to a first embodiment of the present invention, and a method of producing the same.

As shown in FIG. 1(a), a first silicon oxide layer 21 having a thickness of 500 nm for example is deposited, by a CVD method, on a semiconductor substrate 20 made of silicon for example, and a porous layer 22 having a thickness of 400 nm for example is deposited on the first silicon oxide layer 21. Then, a resist pattern is formed on the porous layer 22, and using the resist pattern as a mask, the porous layer 22 is etched to form a wiring groove 22a in the porous layer 22.

As shown in FIG. 1(b), a second silicon oxide layer 23 having a thickness of 20 nm for example is deposited throughout the surface of the porous layer 22 by a CVD method.

As shown in FIG. 1(c), a resist pattern is formed on the second silicon oxide layer 23, and using the resist pattern as a mask, the first and second silicon oxide layers 21, 23 are etched to form a through-hole 21a in the first and second silicon oxide layers 21, 23.

As shown in FIG. 1(d), a conductive layer 24 is deposited throughout the surface of the substrate and those portions of the conductive layer 24 exposed onto the second silicon oxide layer 23 are subjected to CMP, thus forming a wiring layer made of the conductive layer 24.

According to the first embodiment, the second silicon oxide layer 23 is deposited on the surface of the wiring groove 22a in the porous layer 22. Therefore, the conductive material forming the conductive layer does not enter holes in the porous layer 22. This not only prevents the porous layer 22 from being deteriorated in insulating properties, but also prevents the wiring layer from being deteriorated in resistance to electromigration.

(Second Embodiment)

The following description will discuss a semiconductor device according to a second embodiment of the present invention and a method of producing the same. The second embodiment is characterized in a method of forming the porous layer 22 in the first embodiment. Therefore, the following description will only discuss the method of forming the porous layer 22.

First, a silanol sol solution containing inorganic silanol condensate particulates one of which is shown in FIG. 2, is prepared and the residual silanol groups (Si—OH) of the silanol condensate particulates contained in the silanol sol solution are treated with a silylation reagent. FIG. 3 shows a silylation reaction and FIG. 4 shows a silylated silanol condensate particulate obtained by the silylation reaction. In FIG. 4, x shows a silyl group. At least portions of the OH groups forming the silanol groups on the surface are substituted by silyl groups, thus obtaining a silanol condensate particulate in which the residual silanol groups are being chemically modified by silyl groups (silylated silanol condensate particulate). FIG. 5(a) shows a process in which a silanol condensate reacts with a silyl group to form a silylated silanol condensate particulate.

Examples of a silanol condensate particulate include a particulate containing Si-H bonds as shown in FIG. 2.

As the silylation reagent, triphenyl silanol is preferably used because triphenyl silanol is liable to accelerate the silylation reaction and is readily pyrolytically decomposed in a heat treatment to be discussed later.

The silylation reaction temperature is suitably in the range from room temperature to about 50° C.

Dependent on the addition amount of the silylation reagent, the hole size of the porous layer can be controlled in the range from about 20 to about 80 nm. The hole size of the porous layer becomes greater with an increase in the addition amount of the silylation reagent.

The silylation reaction time is suitably set to about 30 minutes but is preferably changed dependent on the type of the silylation reagent.

The aforementioned process for preparing a solution containing a silanol sol can be conducted independently from the semiconductor device production process. Accordingly, the solution preparing time can be considered to be separate from the time required for the semiconductor device production process.

As shown in FIG. 5(b), the solution containing silylated silanol condensate particulates is applied onto a semiconductor substrate under rotation to form a coating film thereon. In the rotational coating, the number of rotation may suitably be set in the range in which a good coating film can be formed, but is preferably set in the range from 2000 to 4000 r.p.m.

Then, the coating film is subjected to a first heat treatment such that silyl groups are pyrolytically decomposed to execute a desilylation treatment as shown in FIG. 5(c). In FIG. 5(c), each of the pyrolytically decomposed silyl groups is marked with a circle. The first heat treatment is preferably conducted at a temperature of 100° C. to 200° C. for about one to about five minutes.

Then, the coating film to which the desilylation treatment has been made, is subjected to a second heat treatment such that the residual silanol groups are dehydrated and condensed, thus forming a porous layer as shown in FIG. 5(d). The second heat treatment is preferably conducted at a temperature of 400° C. to 450° C. for about 30 minutes to about one hour.

In the manner above-mentioned, the silylated layers formed on the surfaces of the silanol condensate particulates ($(SiO_2)_n$) are pyrolytically decomposed such that holes are formed among particulates, thus forming a porous layer as shown in FIG. 6.

As discussed in the foregoing, the second embodiment does not require, in the porous layer forming process, heat treatments which take time as long as 9 to 24 hours. Also, according to the second embodiment, the heat treatments can be conducted at relatively low temperature.

EXAMPLES

The following description will discuss a specific example of the second embodiment.

First, 200 mg of triphenyl silanol as a silylation reagent was added to 5 ml of a solution containing silanol condensate particulates of which concentration was 10 wt % in terms of $SiO_2$, thus forming a silanol sol solution. The silanol sol solution thus obtained was stirred to dissolve the silanol condensate particulates in the silanol sol solution and was left to stand for 17 hours at room temperature. While being passed through a 0.2 $\mu$m-filter, he silanol sol solution was dropped on a 6-inch semiconductor substrate of silicon. While the semiconductor substrate was rotated at 4000 r.p.m. for 20 seconds, the silanol sol solution was applied thereto, thus forming a coating film thereon. The reason of why the silanol sol solution was passed through the filter is to remove impurities in the silanol sol solution. Afterwards, it was made sure using an infrared spectrum (FTIR) that the silylation treatment was conducted by triphenyl silanol.

Then, the coating film was subjected to the first heat treatment at a temperature of 160° C. for three minutes using a hot plate, and then to the second heat treatment in an atmosphere of nitrogen at a temperature of 400° C. for 30 minutes using an electric oven.

Using an infrared spectrum, he coating film was measured after the first heat treatment. It was observed that an absorption peak based on the triphenyl silanol groups disappeared and that holes were formed in the coating film by the first heat treatment.

After the second heat treatment, the coating film was observed at the surface thereof by SEM. Through the observation, it was made sure that the coating film was made porous. Then, the porous layer was observed by a scanning ellipsometry. The thickness and refractive index of the porous layer thus observed were 357 nm and 1.25, respectively. The relative dielectric constant of the porous layer as measured with 1 MHz by a CV method was 2.3.

Instead of triphenyl silanol, there can be used, as the silylation reagent, trialkylalkoxysilane (alkyl group: methyl, ethyl, propyl, butyl; alkoxygroup; ethoxy, methoxy), trialkylchlorosilane (alkyl group: methyl, ethyl, propyl, butyl), trialkylsilanol (alkyl group: methyl, ethyl, propyl, butyl), hexaphenyldisiloxane, alkoxytriphenylsilane, chlorotriphenylsilane, diphenyldialkoxysilane or diphenyl silanol.

(Third Embodiment)

The following description will discuss a semiconductor device according to a third embodiment of the present invention and a method of producing the same. Also, the third embodiment is characterized in a method of forming the porous layer 22 in tbp first embodiment. Thus, the following description will only discuss the method of forming the porous layer 22.

A mixture of tetraethoxysilane and triethoxysilane is hydrolyzed to prepare a silanol solution. FIG. 7(a) shows a process in which tetraethoxysilane is hydrolyzed to form a first reaction product (silanol). FIG. 7(b) shows a process in which triethoxysilane is hydrolyzed to form a second reaction product (silanol). As shown in FIG. 7(c), the first reaction product and the second reaction product are dehydrated and condensed. In this case, a mixture solution of ethanol or ethers may be added as a solvent, in addition to water for hydrolysis. Further, instead of the mixture of tetraethoxysilane and triethoxysilane, triethoxysilane alone may be used. When the mixture above-mentioned is used, the mixture ratio by mol is suitably in the range of 2:1 to 1:2.

Then, while the first reaction product (silanol) and the second reaction product (silanol) are dehydrated and condensed such that silanol condensate particulates are being formed by agglomeration as shown in FIG. 7(c), a silylation reagent such as triphenyl silanol is added in the presence of acid or alkali. Then, the first reaction product and triphenyl silanol react with each other to produce a third reaction product as shown in FIG. 8(a), and the second reaction product and triphenyl silanol react with each other to produce a fourth reaction product as shown in FIG. 8(b). In the process in which the first and second reaction products are dehydrated and condensed to form silanol condensate particulates, the third and fourth reaction products are taken in the silanol condensate particulates, thus forming silanol condensate particulates in which the third and fourth reaction products are being taken.

As acid or alkali to be used in the silylation reaction process, amines or proton acid such as acetic acid can be used.

The silylation reaction temperature is preferably in the range from room temperature to 50° C. and the silylation reaction time is preferably in the range from 5 to 20 hours. When the reaction temperature and time are set in such ranges, respectively, both the agglomeration of silanol due to dehydration/condensation and the silylation of the residual silanol groups by the silylation reagent proceed concurrently, thus forming silanol condensate particulates in which the third and fourth reaction products are being taken.

A semiconductor substrate is rotationally coated with the silanol sol solution containing the silanol condensate particulates in which the third and fourth reaction products are being taken, thus forming a coating film thereon. In the rotational coating, the number of rotation may suitably be set in the range in which a good coating film can be formed, but is preferably set in the range from 2000 to 4000 r.p.m.

Then, the coating film is subjected to a first heat treatment such that the silyl groups in the silanol condensate particulates are pyrolytically decomposed to execute a desilylation treatment. The first heat treatment is preferably conducted at a temperature of 100° C. to 200° C. for about one to about five minutes.

Then, the coating film to which the desilylation treatment has been made, is subjected to a second heat treatment such that the residual silanol groups are dehydrated and condensed, thus forming a porous layer. The second heat treatment is preferably conducted at a temperature of 400° C. to 450° C. for about 30 minutes to about one hour.

Thus, the silyl groups in the silanol condensate particulates are pyrolytically decomposed to form holes in the particulates, thus forming a porous layer.

As discussed in the foregoing, the third embodiment does not require, in the porous layer forming process, heat treatments which take time as long as 9 to 24 hours. Also, according to the third embodiment, the heat treatments can be conducted at relatively low temperature.

According to the third embodiment, holes are formed inside of the silanol condensate particulates to form a porous layer while according to the second embodiment, holes are formed among silanol condensate particulates to form a porous layer. Thus, according to the third embodiment, the holes in the porous layer are smaller in size than those according to the second embodiment.

EXAMPLES

The following description will discuss a specific example of the third embodiment.

After 500 mg of tetraethoxysilane was added to 5 ml of ethanol, 5 µl of acetic acid under strong stirring was added to prepare a first mixture solution. The first mixture solution was left to stand at room temperature for one hour. Then, 200 mg of triphenyl silanol as the silylation reagent was added to the first mixture solution under stirring, thus preparing a second mixture solution. The second mixture solution was left to stand at room temperature for 17 hours. Then, while being passed through a 0.2 µm-filter, 2 ml of the second mixture solution was dropped on a semiconductor substrate. While being rotated at 4000 r.p.m. for 20 seconds, the semiconductor substrate was rotationally coated with the second mixture solution, thus forming a coating film thereon.

Then, the coating film was subjected to the first heat treatment at a temperature of 160° C. for three minutes using a hot plate, and then to the second heat treatment in an atmosphere of nitrogen at a temperature of 400° C. for 30 minutes using an electric oven.

Using an infrared spectrum, the coating film was measured after the first heat treatment. It was observed that an absorption peak based on the triphenyl silanol groups disappeared and that holes were formed in the coating film by the first heat treatment.

After the second heat treatment, the coating film was observed at the surface thereof by SEM. Through the observation, it was made sure that the coating film was made porous. The thickness and refractive index of the porous layer as observed by a spectral エリプソ method were 370 nm and 1.22, respectively. The relative dielectric constant of the porous layer as measured with 1 MHz by a CV method was 2.1.

Instead of triphenyl silanol, there can be used, as the silylation reagent, trialkylalkoxysilane (alkyl group: methyl, ethyl, propyl, butyl; alkoxygroup; ethoxy, methoxy), trialkylchlorosilane (alkyl group: methyl, ethyl, propyl, butyl), trialkylsilanol (alkyl group: methyl, ethyl, propyl, butyl), hexaphenyldisiloxane, alkoxytriphenylsilane, chlorotriphenylsilane, diphenyldialkoxysilane or diphenyl silanol.

In this example, acetic acid was used as a catalyst for dehydration and condensation of silanol. Instead, any of other acids may be used as far as it is a proton acid.

As the catalyst, alkali such as amines may also be used instead of acid.

(Fourth Embodiment)

An insulating layer of a semiconductor device according to a fourth embodiment of the present invention is a bulk-like composite layer in which organic silanol condensate particulates 1 and inorganic silanol condensate particulates 2 are substantially uniformly mixed as shown in FIG. 10. Each of the organic silanol condensate particulates 1 has a molecular structure similar to that shown in FIG. 18, and each of the inorganic silanol condensate particulates 2 does not contain silicon-alkyl group bonds but contains only silicon-oxygen bonds and has silanol groups (Si—OH) on the surface thereof, as shown in FIG. 2.

According to the fourth embodiment, in the organic silanol condensate particulates 1 located in the outermost surface of the insulating layer, the silicon-alkyl group bonds are oxidatively decomposed by oxygen plasma as discussed in Background of the Invention. However, inorganic silanol condensate particulates 2 are present at the inner sides of the organic silanol condensate particulates 1 located in the outermost surface of the insulating layer, and the inorganic silanol condensate particulates 2 are not oxidatively decomposed by oxygen plasma because the inorganic silanol condensate particulates 2 contain only silicon-oxygen bonds. This prevents the oxidative decomposition due to oxygen plasma from proceeding deeply in the insulating layer.

(Fifth Embodiment)

An insulating layer of a semiconductor device according to a fifth embodiment of the present invention is an aggregate layer, as shown in FIG. 11, in which there are aggregated a number of capsular particles 5 in each of which an organic silanol condensate particulate 3 containing organic group-silicon bonds is being chemically modified by inorganic silanol 4 containing only oxygen-silicon bonds.

According to the fifth embodiment, each capsular particle 5 is arranged such that the organic silanol condensate particulate 2 is covered with inorganic silanol 4. Accordingly, the organic silanol condensate particulates 3 are not oxidatively decomposed by oxygen plasma. This prevents the insulating layer from being oxidatively decomposed.

(Sixth Embodiment)

An insulating layer of a semiconductor device according to a sixth embodiment of the present invention is an aggregate layer, as shown in FIG. 12, in which there are aggregated a number of capsular particles 8 in each of which an inorganic silanol condensate particulate 6 containing only silicon-oxygen bonds is being chemically modified by organic silanol 7 containing organic group-silicon bonds.

According to the sixth embodiment, in each capsular particle 8 located in the outermost surface of the insulating layer, the organic silanol 7 is oxidatively decomposed by oxygen plasma. However, the inorganic silanol condensate particulate 6 is present at the inner part of the capsular particle 8. Such inorganic silanol condensate particulates 6 are not oxidatively decomposed. This prevents the oxidative decomposition due to oxygen plasma from proceeding inside of the insulating layer.

Instead of the organic silanol condensate particulates in each of the fourth and fifth embodiments, fluorinated silanol condensate particulates containing fluorine-silicon bonds as shown in FIG. 13 may be used. Further, instead of the organic silanol in the sixth embodiment, there may be used fluorinated silanol containing fluorine-silicon bonds.

(Seventh Embodiment)

The following description will discuss, as a seventh embodiment of the present invention, a semiconductor device according to the fourth embodiment.

First, 100 ml of an inorganic silica sol (commercially available inorganic SOG solution of which concentration was in the range from 3 to 20 wt % in terms of $SiO_2$) was mixed with 50 ml of an organic silica sol (commercially available organic SOG solution of which concentration was in the range from 3 to 20 wt % in terms of $SiO_2$), thus preparing a mixture silica sol.

Then, the mixture silica sol was stirred at room temperature for three hours. As shown in FIG. 14(*a*), a semiconductor substrate 10 having metallic wiring 11 and a first $SiO_2$ layer 12, was spin-coated at the surface thereof with the mixture silica sol at a speed of 3000 r.p.m. Then, the coating mixture silica sol was baked at a temperature of 100° C. for one minute and then at a temperature of 150° C. for one minute using a hot plate. Then, the semiconductor substrate 10 was thermally treated in an atmosphere of nitrogen at a temperature of 400° C. for 30 minutes using an electric oven, thus forming, on the semiconductor substrate 10, an interlaminar insulating layer 13 made of an SOG layer having a thickness of 380 nm.

When the interlaminar insulating layer 13 thus formed was analyzed by infrared spectroscopy, silicon-methyl group bonds were observed. Thus, it was made sure that there was formed a composite layer in which organic silanol condensate particulates and inorganic silanol condensate particulates were mixingly present. The relative dielectric constant of the interlaminar insulating layer 13 as measured by a CV method was about 2.8.

Then, a second $SiO_2$ layer 14 having a thickness of 100 nm was deposited on the interlaminar insulating layer 13 by a CVD method. Using usual lithography, a pattern for a contact hole was formed with the use of a photoresist 15. The first and second $SiO_2$ layers 12, 14 and the interlaminar insulating layer 13 were dry-etched, thus forming a contact hole 16 as shown in FIG. 14(*b*). After the photoresist 15 was removed by ashing using oxygen plasma, the contact hole 16 was checked for shape with an electron microscope. It was observed that side-etching hardly occurred in the contact hole 16 as shown in FIG. 14(*b*).

There was measured the contact resistance of the contact hole 16 formed in the interlaminar insulating layer 13 formed according to the seventh embodiment. The contact resistance thus measured was not greater than that of the interlaminar insulating layer made of a $SiO_2$ layer (plasma TEOS layer) formed by a usual CVD method. In a moistening test, a change in dielectric constant was hardly observed.

By increasing or decreasing the amount of an organic silica sol to be added to an inorganic silica sol, the moisture absorption, the resistance to oxygen plasma and the relative dielectric constant can be adjusted. More specifically, when the organic silica sol is increased in amount, the moisture absorption is decreased, the deterioration in the resistance to oxygen plasma is reduced and the relative dielectric constant is lowered.

Instead of the organic silica sol, there may be added, to the inorganic silica sol, a solution of fluorinated silica sol synthesized by hydrolysis, dehydration and condensation of trimethoxyfluorosilane. In this case, there are obtained fluorinated silanol condensate particulates having fluorine-silicon bonds as shown in FIG. 13.

(Eighth Embodiment)

The following description will discuss, as an eighth embodiment of the present invention, a method of producing the semiconductor device according to the fifth embodiment.

First, 0.2 ml of tetraethoxysilane and 0.05 ml of water were added to 100 ml of an organic silica sol (commercially available organic SOG solution of which concentration was in the range from 3 to 20 wt % in terms of $SiO_2$), thus preparing an organic silica sol.

Then, the organic silica sol was stirred at room temperature for 48 hours. Then, as shown in FIG. 14(a), a semiconductor substrate 10 having metallic wiring 11 and a first $SiO_2$ layer 12, was spin-coated at the surface thereof with this organic silica sol at a speed of 3000 r.p.m. Then, the coating organic silica sol was baked at a temperature of 150° C. for two minutes using a hot plate. Then, the semiconductor substrate 10 was thermally treated in an atmosphere of nitrogen at a temperature of 450° C. for 30 minutes using an electric oven, thus forming, on the semiconductor substrate 10, an interlaminar insulating layer 13 made of an SOG layer having a thickness of 450 nm.

FIG. 15 schematically shows a partially enlarged structure of each of capsular particles forming the interlaminar insulating layer 13, in which an organic silanol condensate particulate 3 is covered with an inorganic silanol 4.

The relative dielectric constant of the interlaminar insulating layer 13 as measured by a CV method was about 2.5.

Then, a second $SiO_2$ layer 14 having a thickness of 100 nm was deposited on the interlaminar insulating layer 13 by a CVD method. Using usual lithography, a pattern for a contact hole was formed with the use of a photoresist 15. The first and second $SiO_2$ layers 12, 14 and the interlaminar insulating layer 13 were dry-etched, thus forming a contact hole 16 as shown in FIG. 14(b). After the photoresist 15 was removed by ashing using oxygen plasma, the contact hole 16 was checked for shape with an electron microscope. It was observed that side-etching hardly occurred in the contact hole 16 as shown in FIG. 14(b).

There was measured the contact resistance of the contact hole 16 in the interlaminar insulating layer 13 formed according to the eighth embodiment. The contact resistance thus measured was not greater than that of the interlaminar insulating layer made of a $SiO_2$ layer (plasma TEOS layer) formed by a usual CVD method. In a moistening test, a change in dielectric constant was hardly observed.

By increasing or decreasing the amount of tetraethoxysilane to be added to the organic silica sol, the moisture absorption, the resistance to oxygen plasma and the relative dielectric constant can be adjusted. More specifically, when tetraethoxysilane is increased in amount, the moisture absorption is increased, the resistance to oxygen plasma is considerably improved and the relative dielectric constant is increased.

(Ninth Embodiment)

The following description will discuss, as a ninth embodiment of the present invention, a method of producing the semiconductor device according to the sixth embodiment.

First, 0.2 ml of triethoxymethylsilane and 0.05 ml of water were added to 100 ml of an inorganic silica sol (commercially available inorganic SOG solution of which concentration was in the range from 3 to 20 wt % in terms of $SiO_2$), thus preparing an inorganic silica sol.

Then, the inorganic silica sol was stirred at room temperature for 48 hours. Then, as shown in FIG. 14(a), a semiconductor substrate 10 having metallic wiring 11 and a first $SiO_2$ layer 12, was spin-coated at the surface thereof with this inorganic silica sol at a speed of 3000 r.p.m. Then, the coating inorganic silica sol was baked at a temperature of 150° C. for two minutes using a hot plate. Then, the semiconductor substrate 10 was thermally treated in an atmosphere of nitrogen at a temperature of 450° C. for 30 minutes using an electric oven, thus forming, on the semiconductor substrate 10, an interlaminar insulating layer 13 made of an SOG layer having a thickness of 450 nm.

The relative dielectric constant of the interlaminar insulating layer 13 as measured by a CV method was about 2.5.

Then, a second $SiO_2$ layer 14 having a thickness of 100 nm was deposited on the interlaminar insulating layer 13 by a CVD method. Using usual lithography, a pattern for a contact hole was formed with the use of a photoresist 15. The first and second $SiO_2$ layers 12, 14 and the interlaminar insulating layer 13 were dry-etched, thus forming a contact hole 16 as shown in FIG. 14(b). After the photoresist 15 was removed by ashing using oxygen plasma, the contact hole 16 was checked for shape with an electron microscope. It was observed that side-etching hardly occurred in the contact hole 16 as shown in FIG. 14(b).

There was measured the contact resistance of the contact hole 16 in the interlaminar insulating layer 13 forme d according to the ninth embodiment. The contact resistance thus measured was not greater than that of the interlaminar insulating layer made of a $SiO_2$ layer (plasma TEOS layer) formed by a usual CVD method. In a moistening test, a change in dielectric constant was hardly observed.

By increasing or decreasing the amount of triethoxymethylsilane to be added to the inorganic silica sol, the moisture resistance, the resistance to oxygen plasma and the relative dielectric constant can be adjusted. More specifically, when triethoxymethylsilane is increased in amount, the moisture absorption is decreased, the resistance to oxygen plasma is less deteriorated and the relative dielectric constant is lowered.

(Tenth Embodiment)

An insulating layer of a semiconductor device according to a tenth embodiment of the present invention is an aggregate layer of silanol condensate particulates in each of which at least portions of the OH groups forming the silanol groups on the surface are being substituted by silyl groups as shown in FIG. 16. In FIG. 16, X is the silyl group and FIG. 17 shows examples of the silyl group.

(Eleventh Embodiment)

The following description will discuss, as an eleventh embodiment of the present invention, a first method of producing the semiconductor device according to the tenth embodiment.

First, 10 ml of hexamethyldisiloxane was added to 100 ml of an inorganic silica sol (commercially available inorganic SOG solution of which concentration was in the range from 3 to 20 wt % in terms of $SiO_2$), thus preparing a silica sol.

Then, the silica sol was stirred at room temperature for three hours. Then, a semiconductor was spin-coated at the surface thereof with this silica sol at a speed of 3000 r.p.m. Then, the inorganic silica sol was baked at a temperature of 100° C. for one minute and then at a temperature of 150° C.

for one minute using a hot plate. Then, the semiconductor substrate was thermally treated in an atmosphere of nitrogen at a temperature of 450° C. for 30 minutes using an electric oven, thus forming, on the semiconductor substrate, an interlaminar insulating layer made of an SOG layer having a thickness of 380 nm.

When the interlaminar insulating layer thus formed was analyzed by infrared spectroscopy, silicon-methyl group bonds were recognized. Thus, it was made sure that the surfaces of the silanol condensate particulates underwent a silylation reaction. The relative dielectric constant of the interlaminar insulating layer as measured by a CV method was about 2.8.

Then, a $SiO_2$ layer having a thickness of 100 nm was deposited on the interlaminar insulating layer by a CVD method. Using usual lithography, a pattern for a contact hole was formed with the use of a photoresist. The SiO, layer and the interlaminar insulating layer were dry-etched, thus forming a contact hole. After the photoresist was removed by ashing using oxygen plasma, the contact hole was checked for shape with an electron microscope. It was observed that side-etching hardly occurred in the contact hole.

There was measured the contact resistance of the contact hole formed in the interlaminar insulating layer. The contact resistance thus measured was not greater than that of the interlaminar insulating layer made of a $SiO_2$ layer (plasma TEOS layer) formed by a usual CVD method.

By increasing or decreasing the amount of hexamethyldisiloxane to be added to the inorganic silica sol, the moisture resistance, the resistance to oxygen plasma and the relative dielectric constant can be adjusted.

Instead of hexamethyldisiloxane as the silylation reagent, there may be used triethylchlorosilane, hexamethyldisilazane or the like with similar effects produced.

To adjust the coating properties of the silica sol, the silylation reagent may be dissolved in a suitable non-aqueous solvent such as hexane, acetone, ethanol or the like, and then mixed with an inorganic silica sol.

(Twelfth Embodiment)

The following description will discuss, as a twelfth embodiment of the present invention, a second method of producing the semiconductor device according to the tenth embodiment.

At a speed of 3,000 r.p.m., a semiconductor substrate was spin-coated at the surface thereof with an inorganic silica sol (commercially available inorganic SOG solution of which concentration was in the range from 3 to 20 wt % in terms of $SiO_2$), thus preparing a wet gel layer. While being heated at 160° C., the semiconductor substrate was exposed, for 10 minutes, to gas obtained by vaporizing hexamethyldisilazane serving as the silylation reagent. Then, the semiconductor substrate was thermally treated in an atmosphere of nitrogen at a temperature of 450° C. for 30 minutes using an electric oven, thus forming, on the semiconductor substrate, an interlaminar insulating layer made of an SOG layer having a thickness of 380 nm.

When the interlaminar insulating layer thus formed was analyzed by infrared spectroscopy, silicon-methyl group bonds were recognized. Thus, it was made sure that the surfaces of the silanol condensate particulates underwent a silylation reaction. The relative dielectric constant of the interlaminar insulating layer as measured by a CV method was about 2.9.

Then, a $SiO_2$ layer having a thickness of 100 nm was deposited on the interlaminar insulating layer by a CVD method. Using usual lithography, a pattern for a contact hole was formed with the use of a photoresist. The $SiO_2$ layer and the interlaminar insulating layer were dry-etched, thus forming a contact hole. After the photoresist was removed by ashing using oxygen plasma, the contact hole was checked for shape with an electron microscope. It was observed that side-etching hardly occurred in the contact hole.

There was measured the contact resistance of the contact hole formed in the interlaminar insulating layer. The contact resistance thus measured was not greater than that of the interlaminar insulating layer made of a $SiO_2$ layer (plasma TEOS layer) formed by a usual CVD method.

By changing the temperature and time of exposure of the semiconductor substrate to the silylation reagent in the form of gas, the silylation rate of residual silanol groups can be adjusted. Thus, the moisture resistance, the resistance to oxygen plasma and the relative dielectric constant can be adjusted.

Instead of hexamethyldisilazane as the silylation reagent, there may be used triethylchlorosilane, hexamethyldisiloxane or the like with similar effects produced.

(Thirteenth Embodiment)

The following description will discuss, as a thirteenth embodiment of the present invention, a third method of producing the semiconductor device according to the tenth embodiment.

At a speed of 3,000 r.p.m., a semiconductor substrate was spin-coated at the surface thereof with an inorganic silica sol (commercially available inorganic SOG solution of which concentration was in the range from 3 to 20 wt % in terms of $SiO_2$), thus preparing a wet gel layer. As the silylation reagent, hexamethyldisilazane was dropped on the semiconductor substrate. The semiconductor substrate was left to stand for 10 minutes and then spin-dried. Then, the semiconductor substrate was thermally treated in an atmosphere of nitrogen at a temperature of 450° C. for 30 minutes using an electric oven, thus forming, on the semiconductor substrate, an interlaminar insulating layer made of an SOG layer having a thickness of 380 nm.

When the interlaminar insulating layer thus formed was analyzed by infrared spectroscopy, silicon-methyl group bonds were recognized. Thus, it was made sure that the surfaces of the inorganic silanol condensate particulates underwent a silylation reaction. The relative dielectric constant of the interlaminar insulating layer as measured by a CV method was about 3.0.

Then, a $SiO_2$ layer having a thickness of 100 nm was deposited on the interlaminar insulating layer by a CVD method. Using usual lithography, a pattern for a contact hole was formed with the use of a photoresist. The $SiO_2$ layer and the interlaminar insulating layer were dry-etched, thus forming a contact hole. After the photoresist was removed by ashing using oxygen plasma, the contact hole was checked for shape with an electron microscope. It was observed that side-etching hardly occurred in the contact hole.

There was measured the contact resistance of the contact hole formed in the interlaminar insulating layer. The contact resistance thus measured was not greater than that of the interlaminar insulating layer made of a $SiO_2$ layer (plasma TEOS layer) formed by a usual CVD method.

By changing the temperature and time of reaction with the silylation reagent, the silylation rate of residual silanol groups can be adjusted. Thus, the moisture resistance, the resistance to oxygen plasma and the relative dielectric constant can be adjusted.

Instead of the third producing method, a non-aqueous solvent in which the silylation reagent is being dissolved, may be dropped on the wet gel layer on the semiconductor substrate. Alternately, the semiconductor substrate having a wet gel layer formed thereon, may be immersed in a silylation reagent heated to its boiling point or less, or in a solution of a silylation reagent heated to its boiling point or less.

Instead of hexamethyldisilazane as the silylation reagent, there may be used triethylchlorosilane, hexamethyldisiloxane or the like with similar effects produced.

(Fourteenth Embodiment)

The following description will discuss, as a fourteenth embodiment of the present invention, a fourth method of producing the semiconductor device according to the tenth embodiment.

At a speed of 3,000 r.p.m., a semiconductor substrate was spin-coated at the surface thereof with an inorganic silica sol (commercially available inorganic SOG solution of which concentration was in the range from 3 to 20 wt % in terms of $SiO_2$), thus preparing a wet gel layer. The semiconductor substrate was housed in a hermetically sealed container filled with gas of hexamethyldisilazane as the silylation reagent. Then, the semiconductor substrate in the hermetically sealed container underwent a silylation reaction at a temperature of 200° C. under 50 atmospheric pressure for 10 minutes. Then, with the temperature maintained constant and the pressure brought back to 1 atmospheric pressure, the wet gel layer was dried. Then, the semiconductor substrate was thermally treated in an atmosphere of nitrogen at a temperature of 450° C. for 30 minutes using an electric oven, thus forming, on the semiconductor substrate, an interlaminar insulating layer made of an SOG layer having a thickness of 380 nm.

When the interlaminar insulating layer thus formed was analyzed by infrared spectroscopy, silicon-methyl group bonds were recognized. Thus, it was made sure that the surfaces of the inorganic silanol condensate particulates underwent a silylation reaction. The relative dielectric constant of the interlaminar insulating layer as measured by a CV method was about 3.0.

Then, a $SiO_2$ layer having a thickness of 100 nm was deposited on the interlaminar insulating layer by a CVD method. Using usual lithography, a pattern for a contact hole was formed with the use of a photoresist. The $SiO_2$ layer and the interlaminar insulating layer were dry-etched, thus forming a contact hole. After the photoresist was removed by ashing using oxygen plasma, the contact hole was checked for shape with an electron microscope. It was observed that side-etching hardly occurred in the contact hole.

There was measured the contact resistance of the contact hole formed in the interlaminar insulating layer. The contact resistance thus measured was not greater than that of the interlaminar insulating layer made of a $SiO_2$ layer (plasma TEOS layer) formed by a usual CVD method.

By changing the temperature, pressure and time of reaction with the silylation reagent, the silylation rate of residual silanol groups can be adjusted. Thus, the moisture resistance, the resistance to oxygen plasma and the relative dielectric constant can be adjusted.

Instead of the fourth producing method, the semiconductor substrate having a wet gel layer formed thereon may be immersed in a solution in which the silylation reagent is being dissolved in a non-aqueous solvent, and the semiconductor substrate may undergo a reaction at a high temperature under a high pressure.

Instead of hexamethyldisilazane as the silylation reagent, there may be used triethylchlorosilane, hexamethyldisiloxane or the like with similar effects produced.

DESCRIPTION OF THE DRAWINGS

FIG. 7(a) to FIG. 7(c) show chemical reactions in the method of producing the semiconductor device according to the second embodiment of the present invention; in which FIG. 7(a) shows how tetraethoxysilane is hydrolyzed to produce a first reaction product, FIG. 7(b) shows how triethoxysilane is hydrolyzed to produce a second reaction product, and FIG. 7(c) shows a dehydration and condensation reaction of the first and second reaction products;

FIG. 8(a) and FIG. 8(b) show chemical reactions in the method of producing the semiconductor device according to the second embodiment of the present invention; in which FIG. 8(a) shows how the first reaction product reacts with triphenyl silanol to produce a third reaction product, and FIG. 8(b) shows how the second reaction product reacts with triphenyl silanol to produce a fourth reaction product;

Figure 1A:
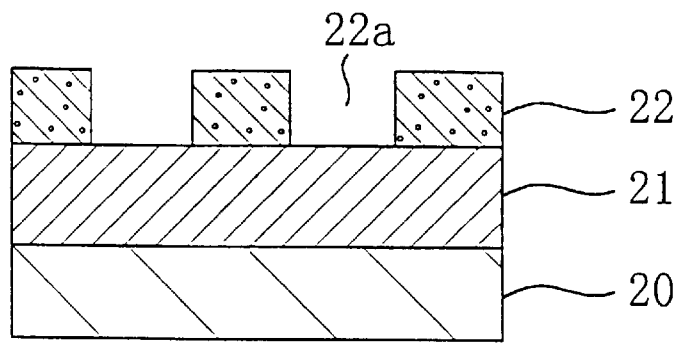
FIG. 1(a) to FIG. 1(d) are section views illustrating steps of a method of producing a semiconductor device according to a first embodiment of the present invention.
Figure 1B:
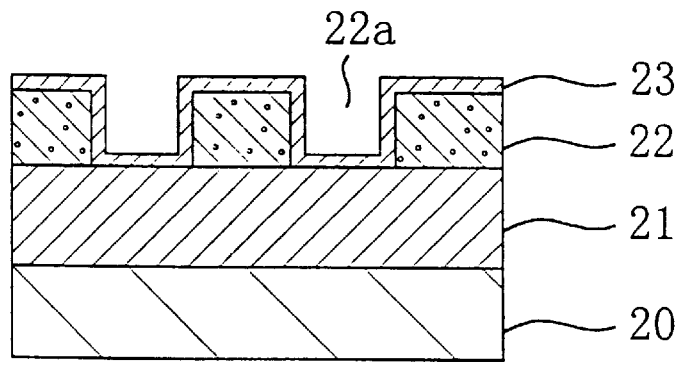
Figure 1C:
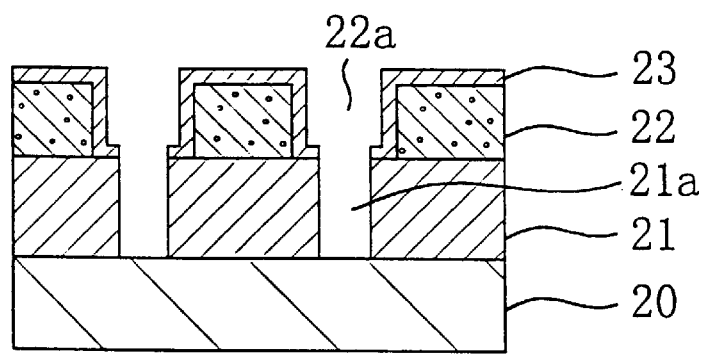
Figure 1D:
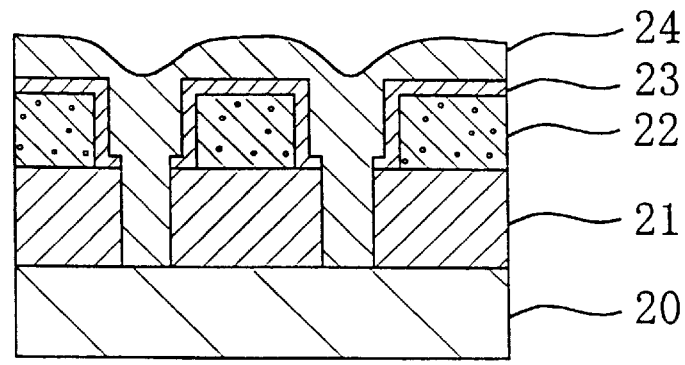
Figure 2:
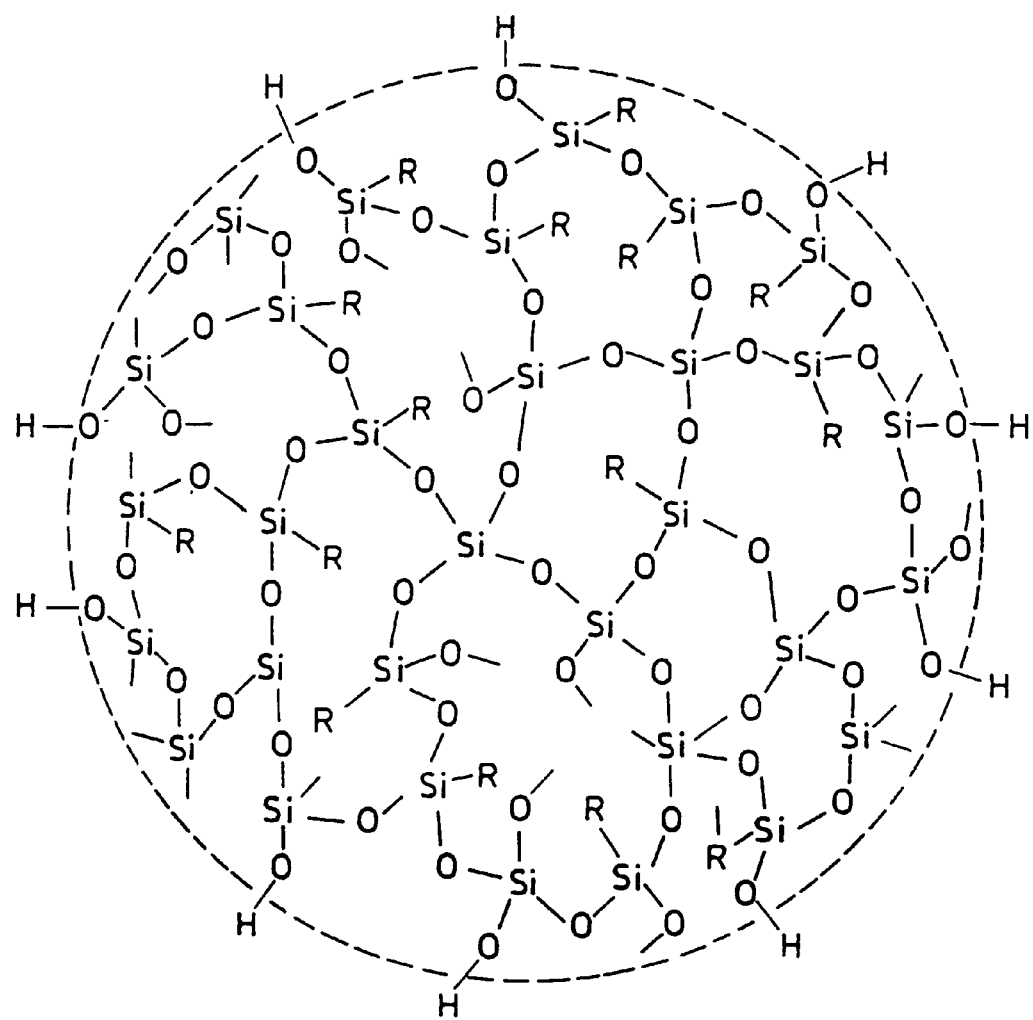
FIG. 2 shows a silanol condensate particulate to be used in a method of producing a semiconductor device according to a second embodiment of the present invention.
Figure 3:
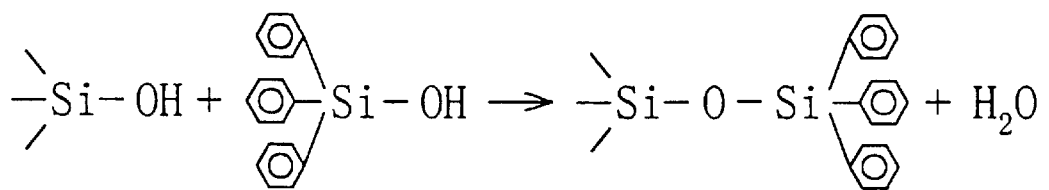
FIG. 3 shows a silylation reaction in the method of producing the semiconductor device according to the second embodiment of the present invention.
Figure 4:
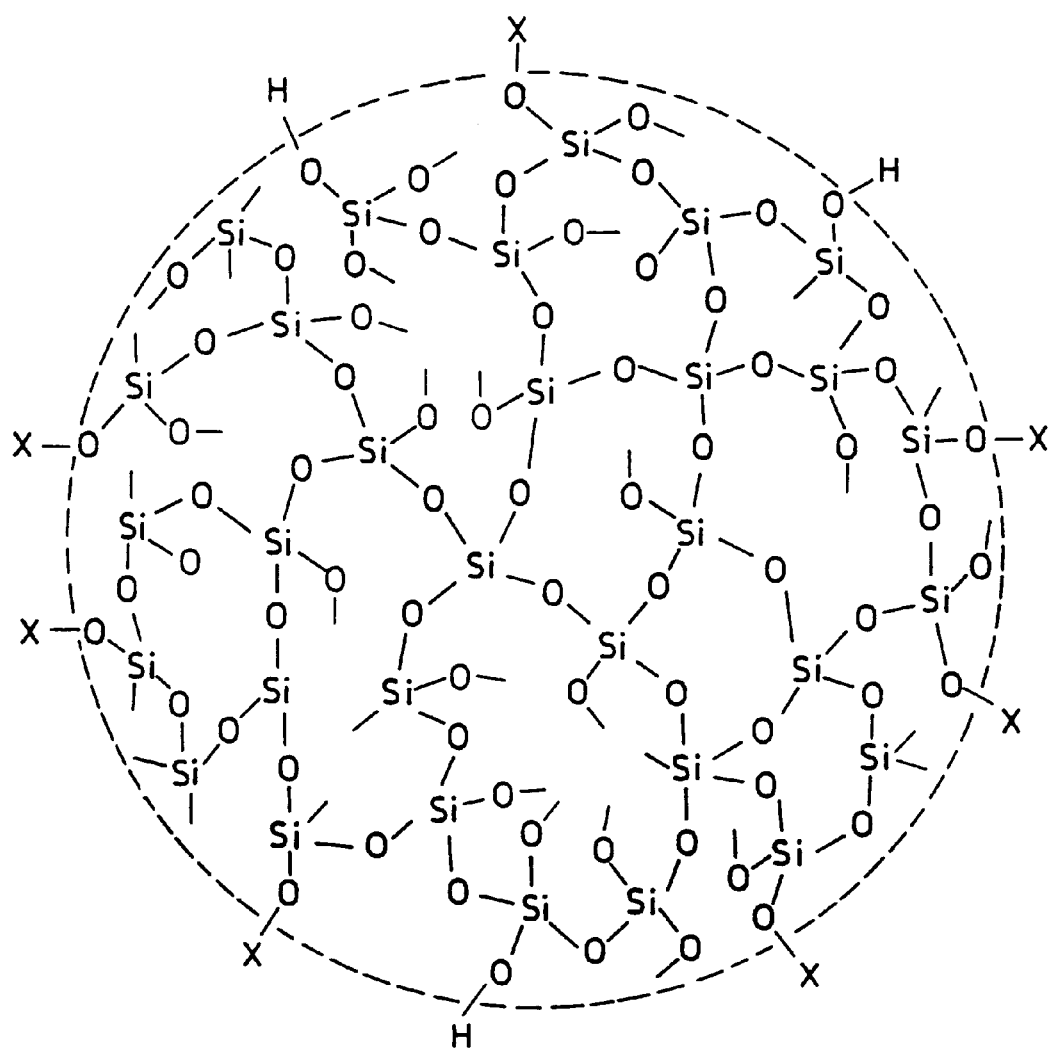
FIG. 4 shows, in the method of producing the semiconductor device according to the second embodiment of the present invention, how residual silanol groups of a silanol condensate particulate are silylated.
Figure 5A:
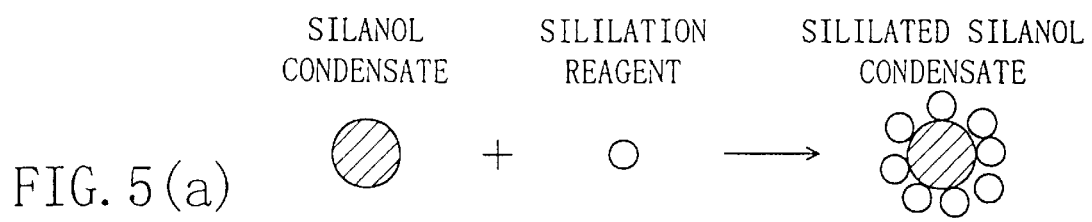
FIG. 5(a) to FIG. 5(d) are schematic views illustrating steps of the method of producing the semiconductor device according to the second embodiment of the present invention.
Figure 5B:
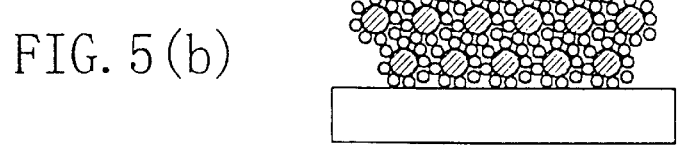
Figure 5C:
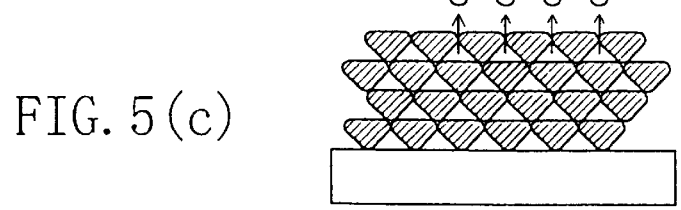
Figure 5D:
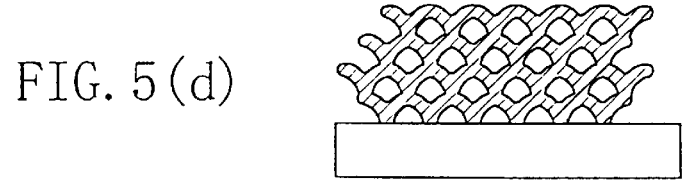
Figure 6:
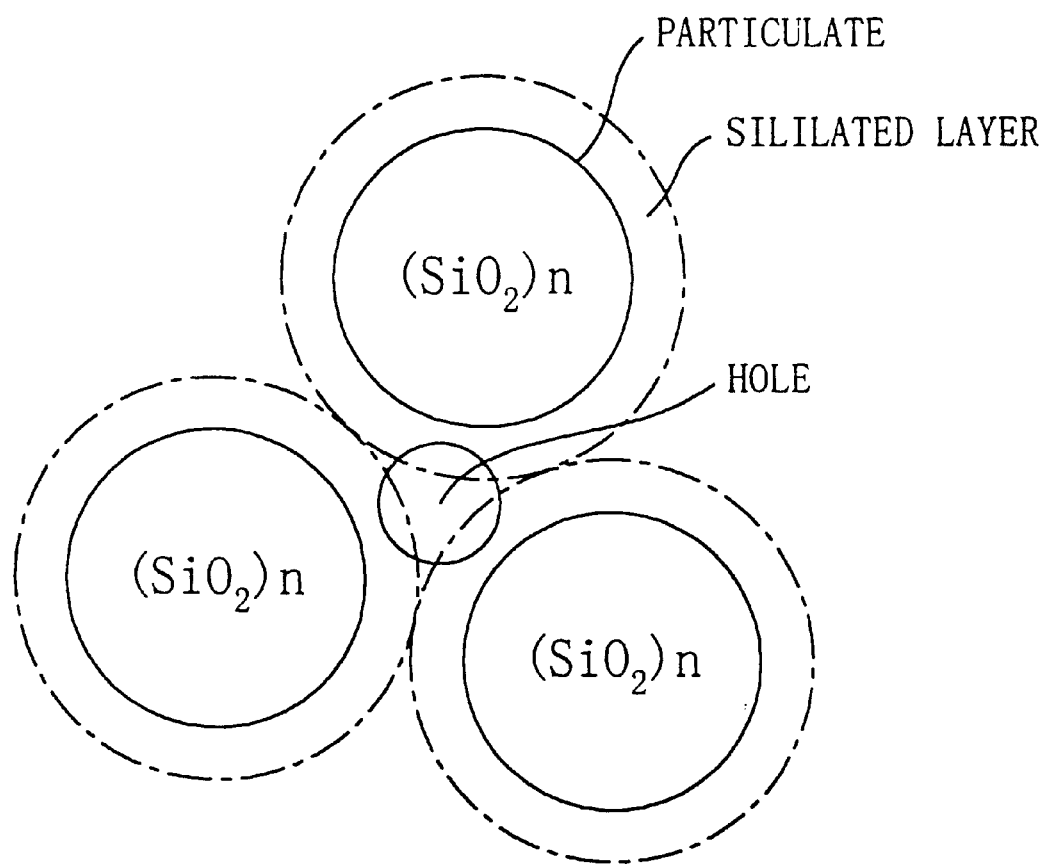
FIG. 6 is a schematic view illustrating, in the method of producing the semiconductor device according to the second embodiment of the present invention, how a porous layer is formed from a silanol sol containing silylated silanol condensate particulates.
Figure 7A:
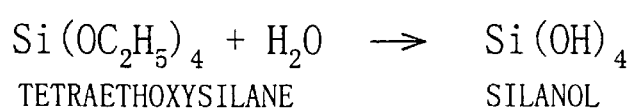
Figure 7B:
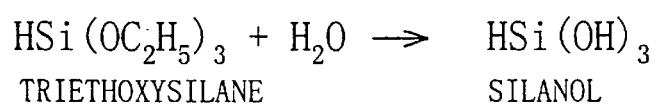
Figure 7C:
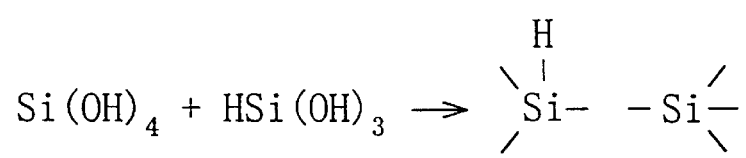
Figure 8A:
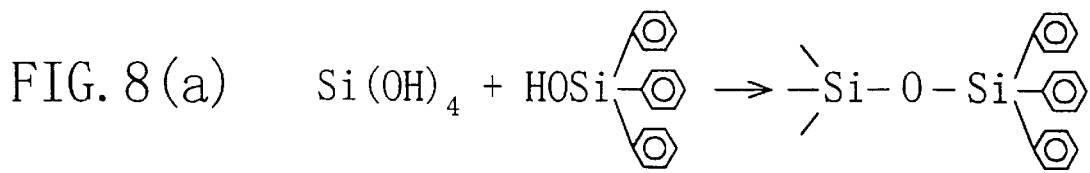
Figure 8B:
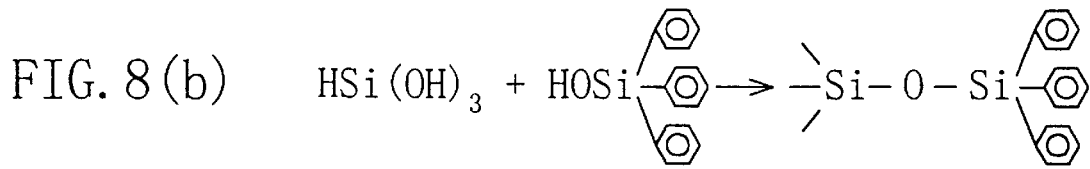
Figure 9:
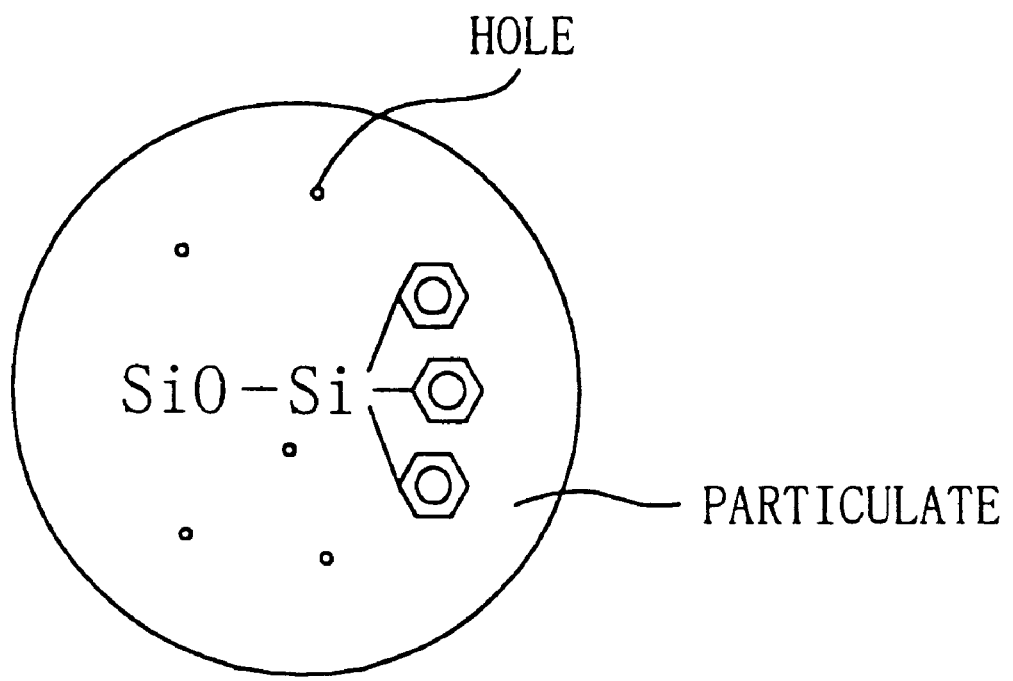
FIG. 9 schematically shows, in a method of producing a semiconductor device according to a third embodiment of the present invention, how a silyl group is pyrolytically decomposed from a silanol condensate particulate in which the third and fourth reaction products are being taken, and how residual silanol groups are dehydrated and condensed to form holes in the particulate.
Figure 10:
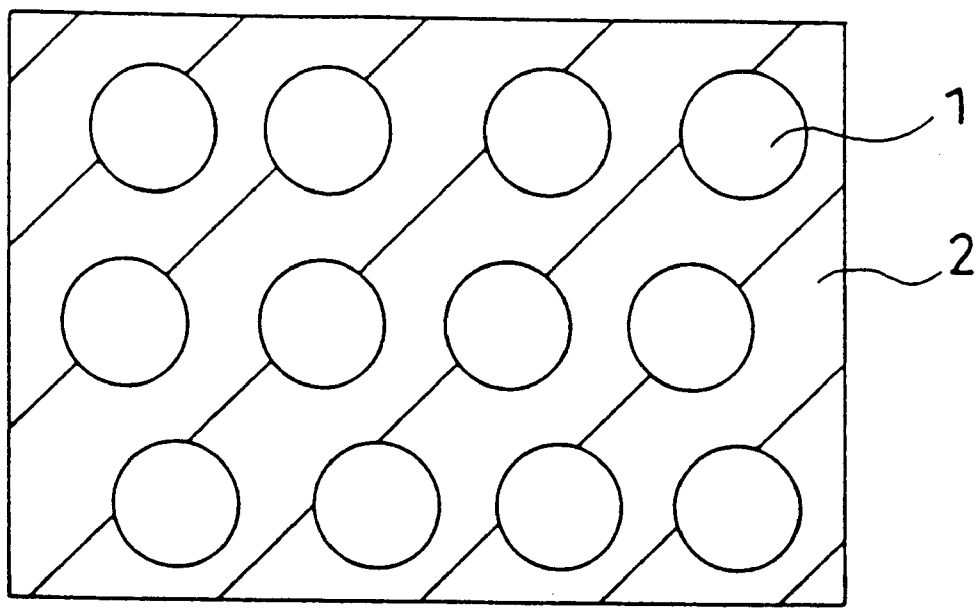
FIG. 10 is a schematic section view illustrating the structure of an insulating layer in a semiconductor device according to a fourth embodiment of the present invention.
Figure 11:
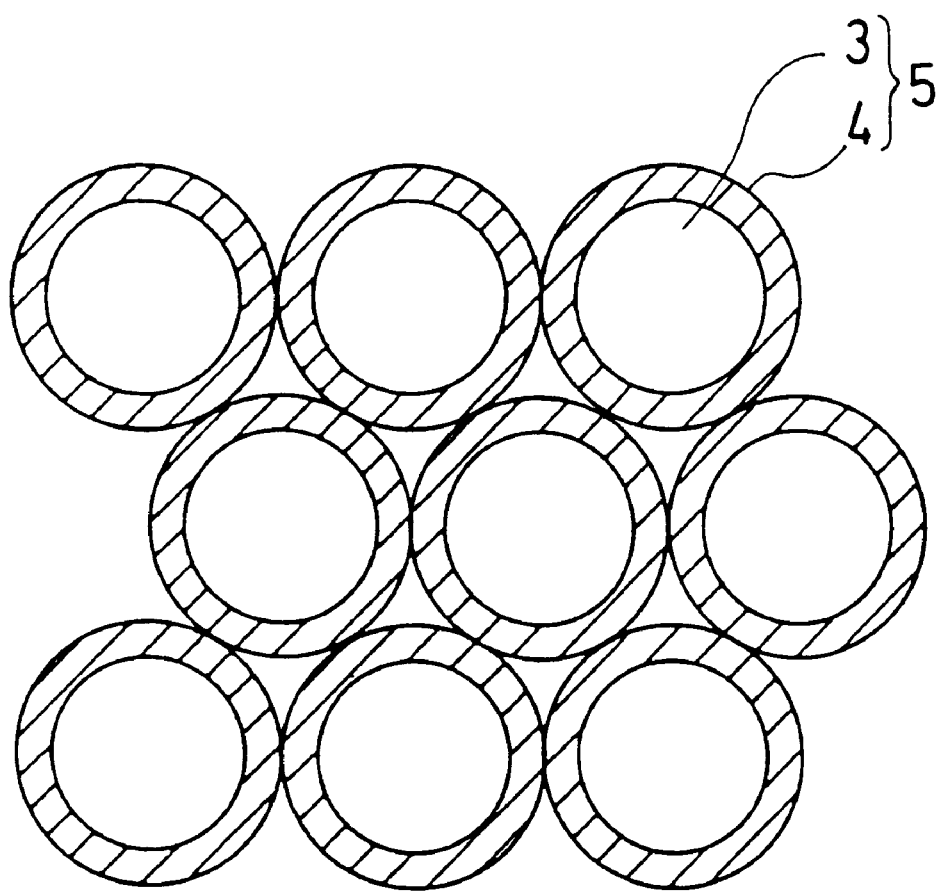
FIG. 11 is a schematic section view illustrating the structure of an insulating layer in a semiconductor device according to a fifth embodiment of the present invention.
Figure 12:
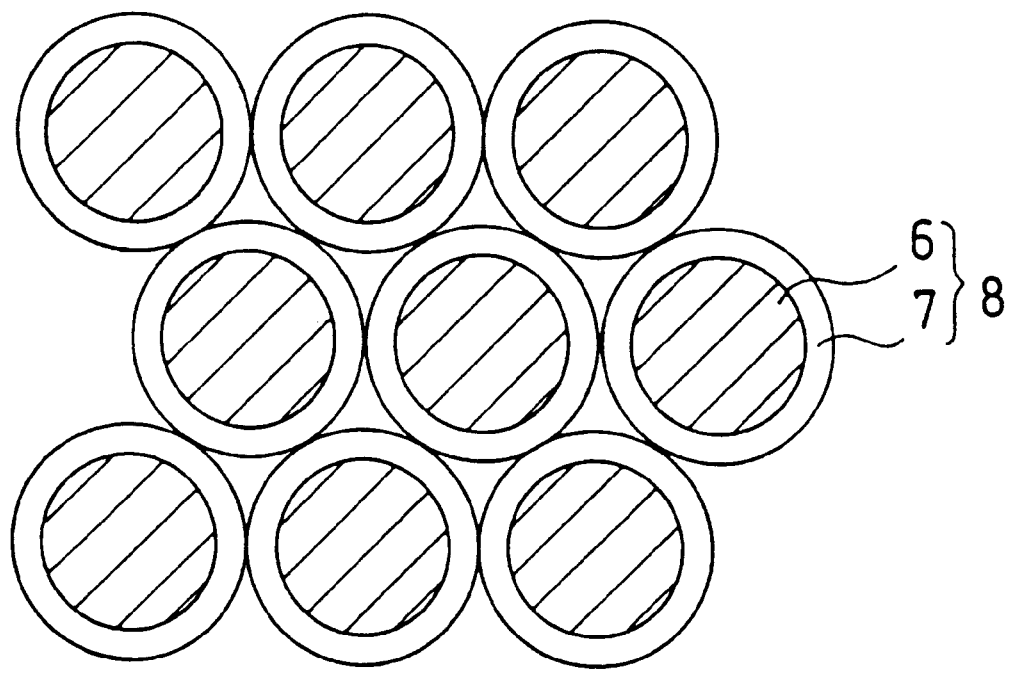
FIG. 12 is a schematic section view illustrating the structure of an insulating layer in a semiconductor device according to a sixth embodiment of the present invention.
Figure 13:
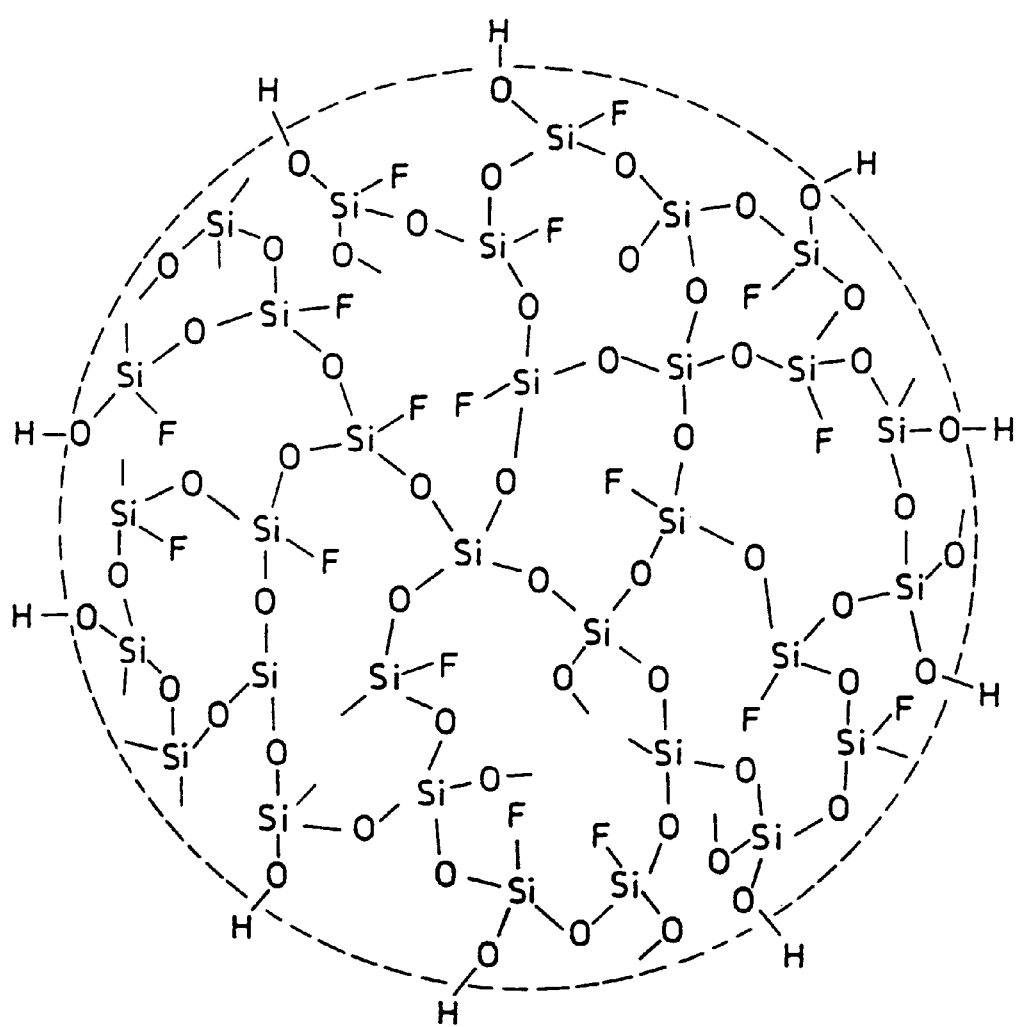
FIG. 13 is a schematic view illustrating the molecular structure of a fluorinated silanol condensate particulate in each of the fourth to sixth embodiments of the present invention.
Figure 14A:
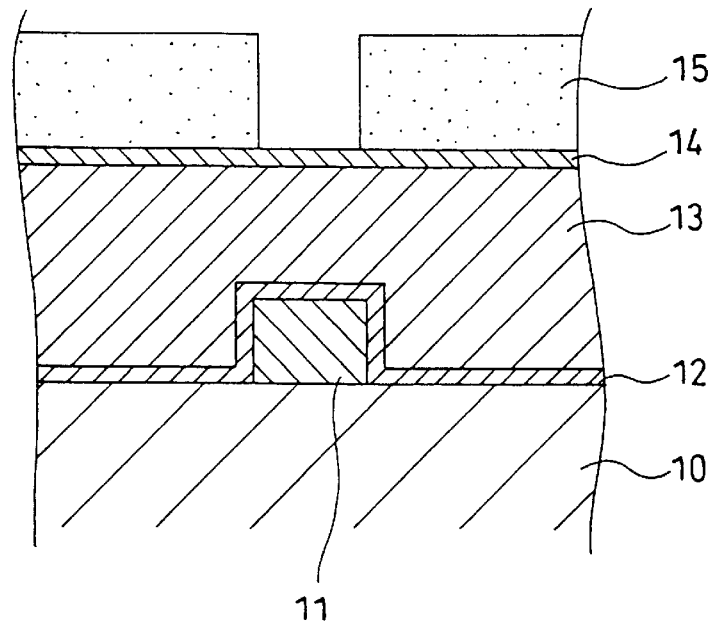
FIG. 14(a) and FIG. 14(b) are section views illustrating steps of a method of producing the semiconductor device according to each of the fourth to sixth embodiments of the present invention.
Figure 14B:
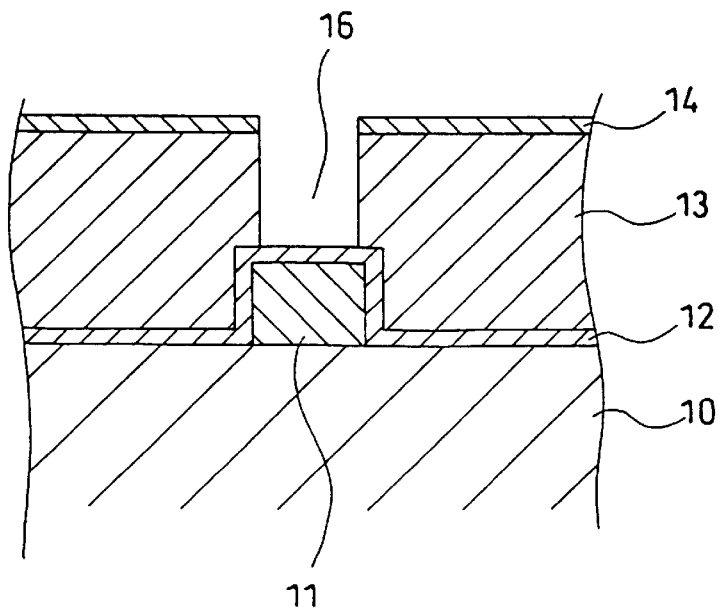
Figure 15:
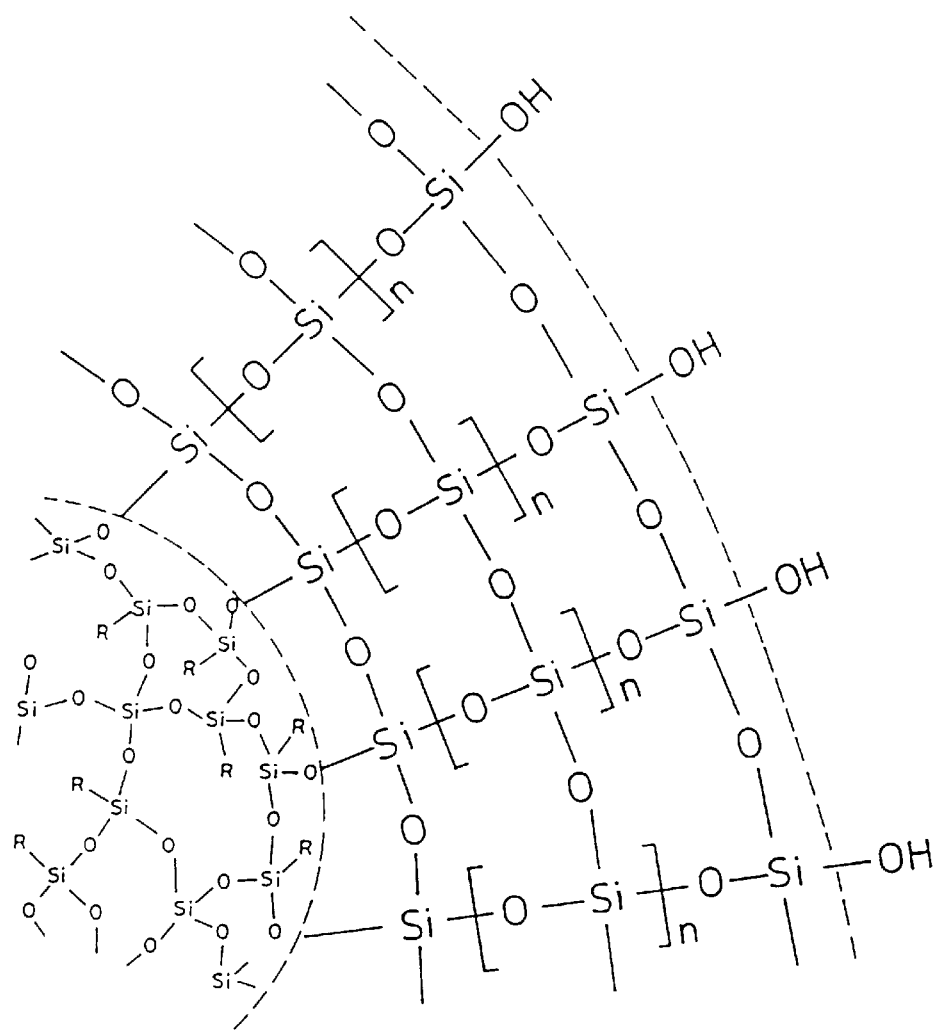
FIG. 15 is a schematic view illustrating the molecular structure of a capsular particle in the semiconductor device according to the fifth embodiment of the present invention.
Figure 15:
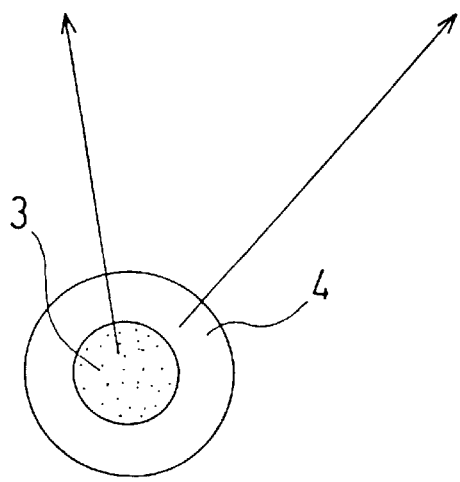
Figure 16:
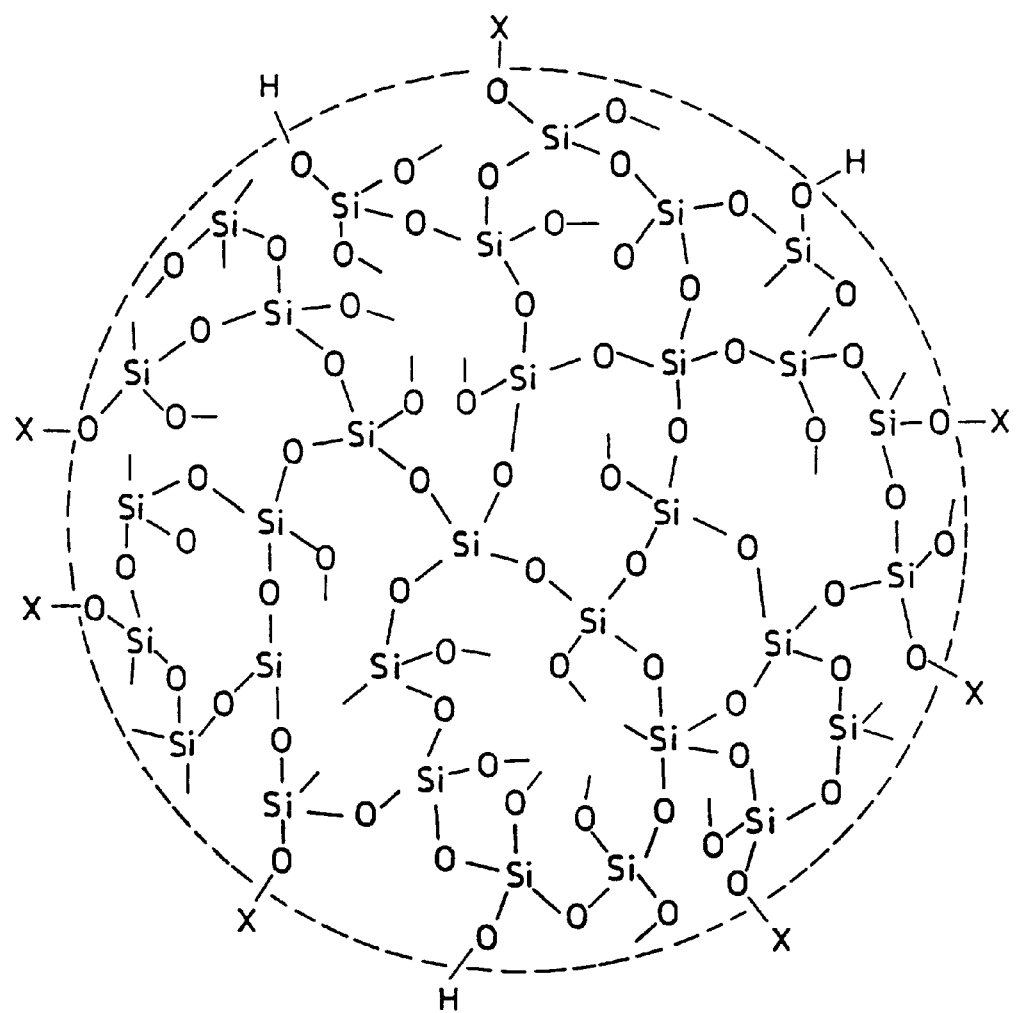
FIG. 16 is a schematic view illustrating the molecular structure of a silylated silanol condensate particulate in a semiconductor device according to a tenth embodiment of the present invention.
Figure 17:
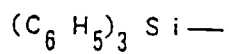
FIG. 17 shows the chemical formulas of examples of a silyl group in the molecular structure of the silylated silanol condensate particulate shown in FIG. 16.
Figure 17:
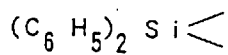
Figure 17:
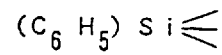
Figure 17:
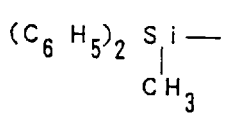
Figure 17:
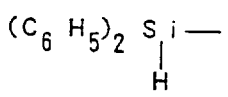
Figure 17:
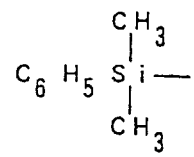
Figure 17:
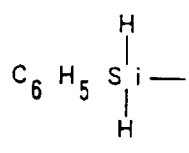
Figure 17:
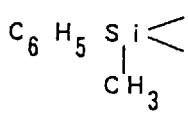
Figure 17:
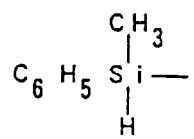
Figure 17:
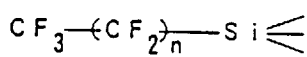
Figure 17:
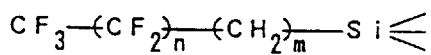
Figure 17:
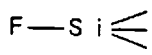
Figure 17:
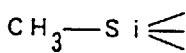
Figure 17:
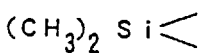
Figure 17:
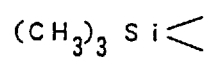
Figure 17:
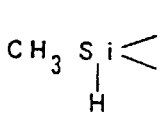
Figure 17:
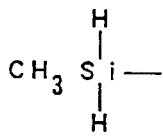
Figure 17:
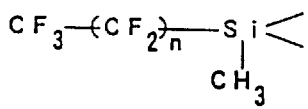
Figure 17:
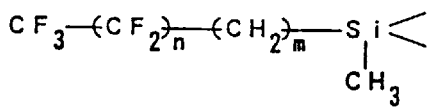
Figure 17:
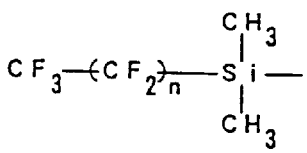
Figure 17:
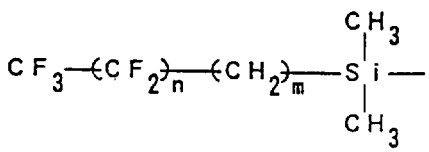
Figure 17:
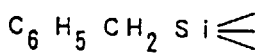
Figure 17:
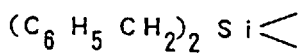
Figure 17:
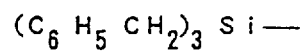
Figure 17:
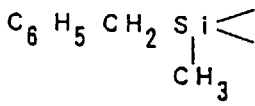
Figure 17:
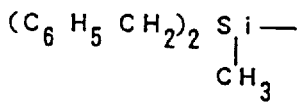
Figure 18:
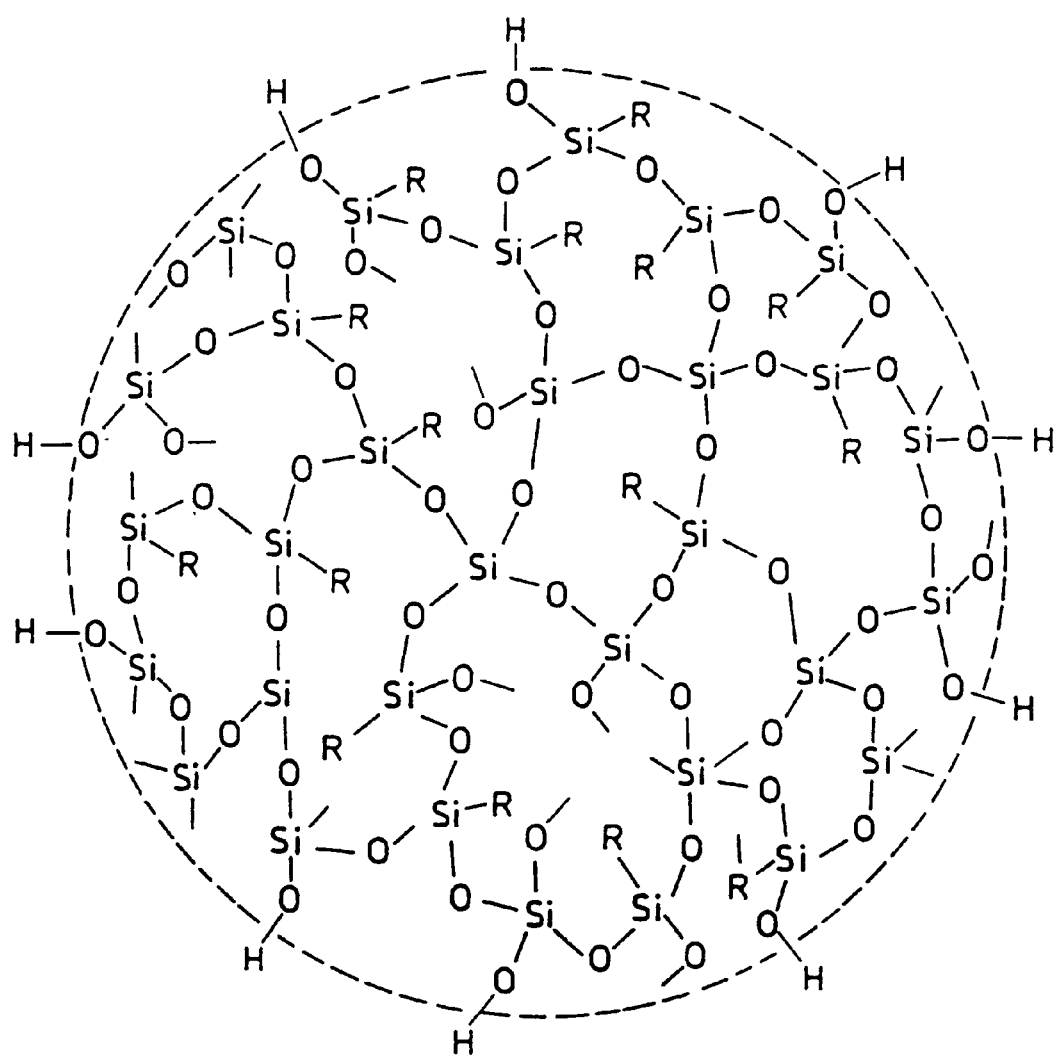
FIG. 18 is a schematic view illustrating the molecular structure of an organic silanol condensate particulate in each of the embodiments of the present invention and in prior art.
Figure 19A:
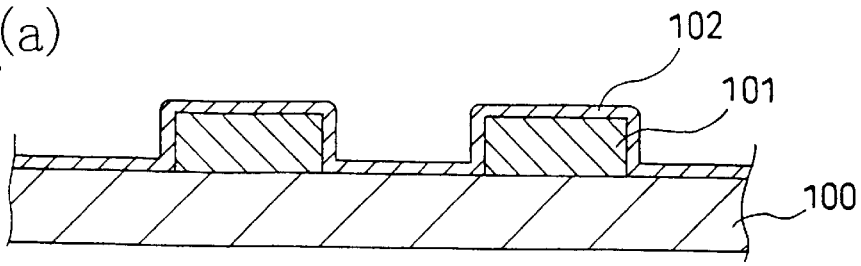
FIG. 19(a) to FIG. 19(c) are section views illustrating steps of a method of producing a semiconductor device of prior art.
Figure 19B:
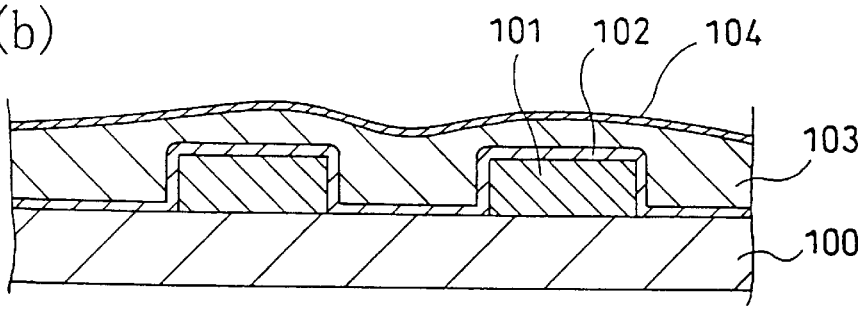
Figure 19C:
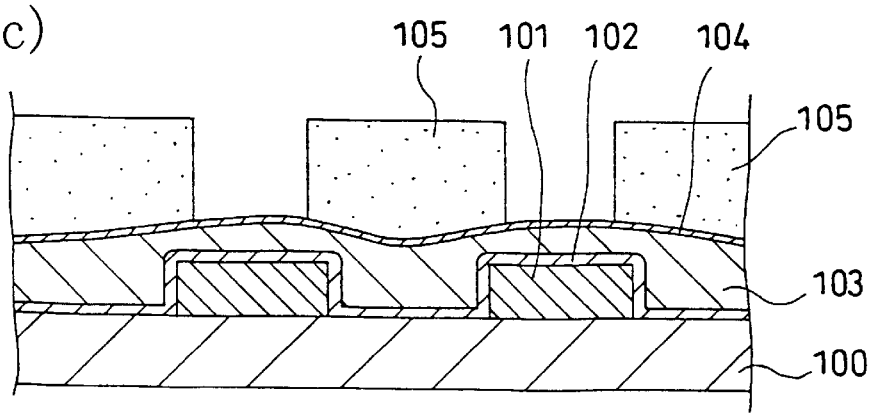
Figure 20A:
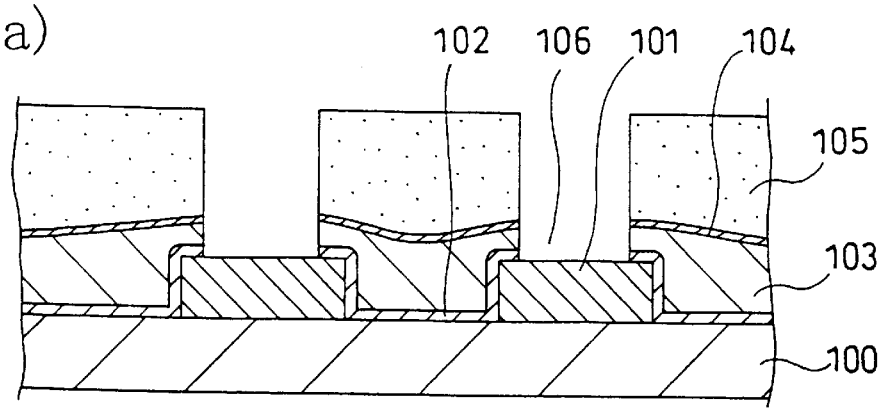
FIG. 20(a) to FIG. 20(c) are section views illustrating steps of the method of producing the semiconductor device of prior art.
Figure 20B:
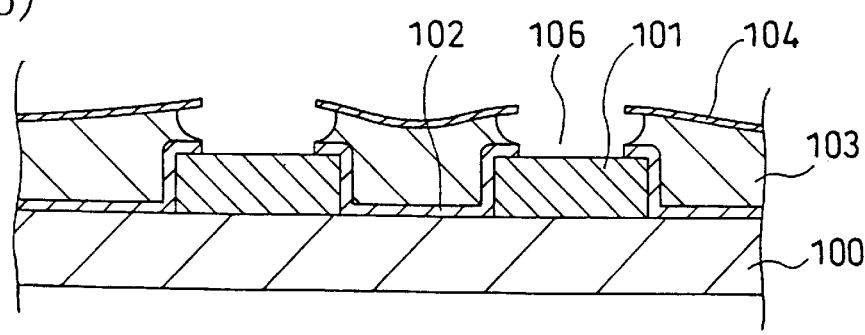
Figure 20C:
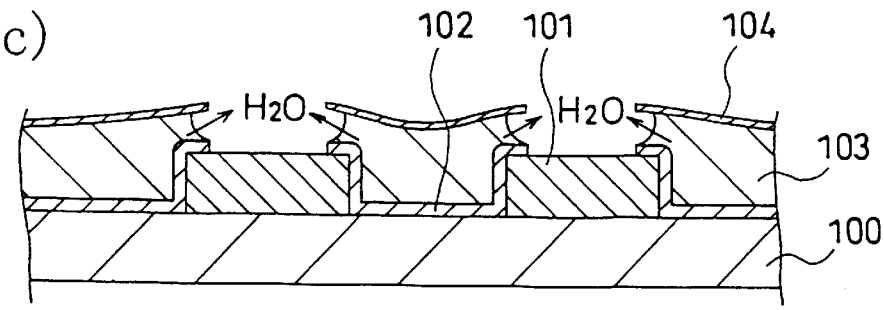
Figure 21:
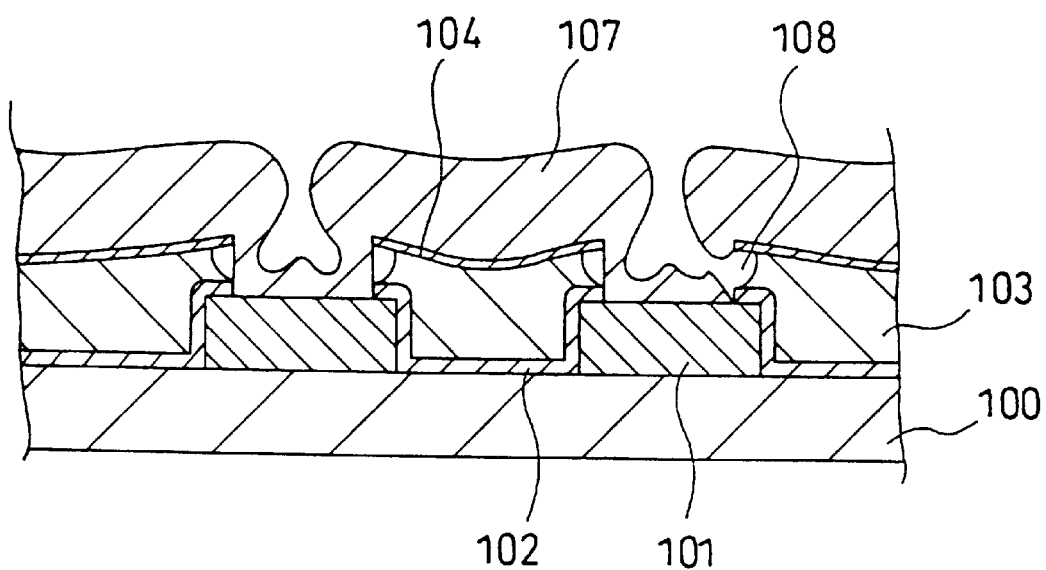
FIG. 21 is a section view illustrating a step of the method of producing the semiconductor device of prior art.
Figure 22:
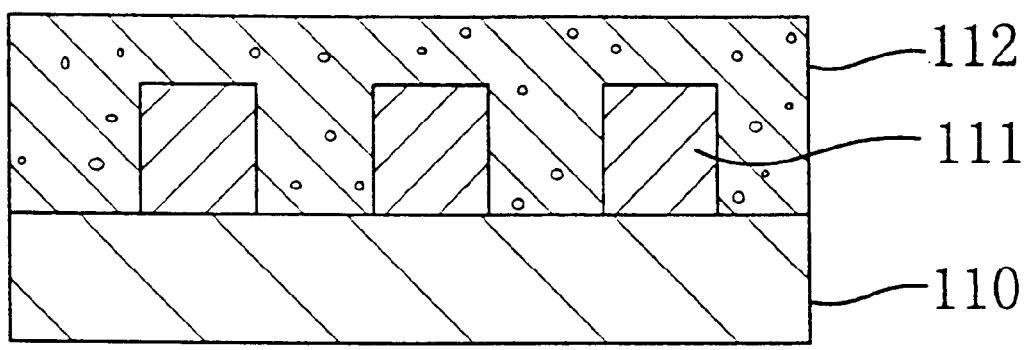
FIG. 22 is a section view of a semiconductor device of prior art.
Figure 23:
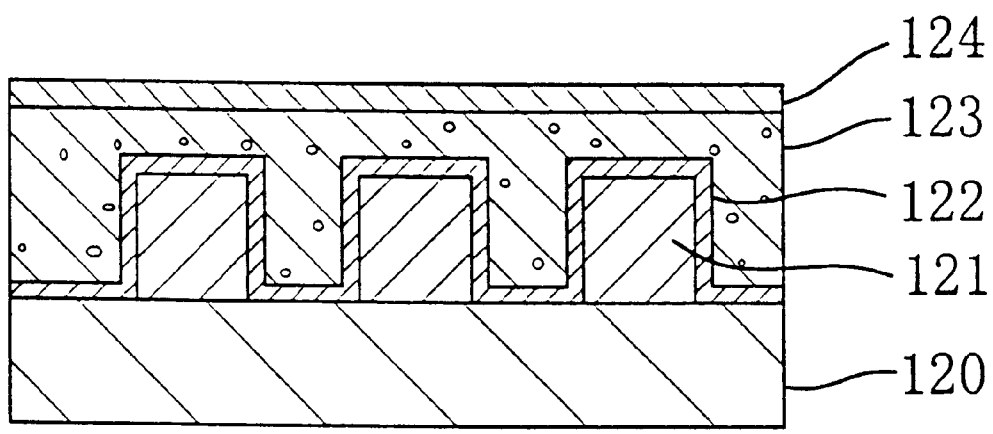
FIG. 23 is a section view of a semiconductor device of prior art.

What is claimed is:

1. A method of forming a dielectric material on a semiconductor substrate, said method comprising the steps of:

adding a silylation reagent to a silanol sol solution containing silanol condensate particulates to chemically modify the residual silanol groups of said silanol condensate particulates by silyl groups prior to coating the surface of said semiconductor substrate with said silanol sol solution;

coating the surface of said semiconductor substrate with said silanol sol solution containing said silanol condensate particulates chemically modified by said silyl groups, thus forming a coating film; and thermally treating said coating film such that said silyl groups are decomposed and that said residual silanol groups are dehydrated and condensed, thus making said coating film porous.

2. The method of forming a dielectric material on a semiconductor substrate according to claim 1, wherein said semiconductor substrate has a first wiring layer formed thereon, said dielectric material being deposited over said semiconductor substrate and said first wiring layer and forming an interlaminer insulating layer.

3. The method of forming a dielectric material on a semiconductor substrate according to claim 2, further comprising a wiring layer step of forming a second wiring layer on said interlaminer insulating layer.

* * * * *